(12) United States Patent
Stalnaker et al.

(10) Patent No.: US 9,428,018 B2
(45) Date of Patent: Aug. 30, 2016

(54) SCALABLE VEHICLE MODELS FOR INDOOR TIRE TESTING

(71) Applicant: Bridgestone Americas Tire Operations, LLC, Nashville, TN (US)

(72) Inventors: David O. Stalnaker, Hartville, OH (US); Ke Jun Xie, Copley, OH (US); Erik F. Knuth, Hudson, OH (US); John L. Turner, Tucson, AZ (US); Paul M. Neugebauer, Akron, OH (US)

(73) Assignee: Bridgestone Americas Tire Operations, LLC, Nashville, TN (US)

( * ) Notice: Subject to any disclaimer, the term of this patent is extended or adjusted under 35 U.S.C. 154(b) by 0 days.

(21) Appl. No.: 14/529,536

(22) Filed: Oct. 31, 2014

(65) Prior Publication Data

US 2015/0057951 A1 Feb. 26, 2015

Related U.S. Application Data

(63) Continuation-in-part of application No. PCT/US2013/073969, filed on Dec. 10, 2013, and a continuation-in-part of application No. 14/043,948, filed on Oct. 2, 2013, now abandoned.

(60) Provisional application No. 61/746,913, filed on Dec. 28, 2012, provisional application No. 61/746,913, filed on Dec. 28, 2012.

(51) Int. Cl.
*G01B 5/06* (2006.01)
*G01B 5/02* (2006.01)
(Continued)

(52) U.S. Cl.
CPC ......... *B60C 99/006* (2013.04); *G06F 17/5095* (2013.01); *G01M 17/02* (2013.01); *G06F 17/5018* (2013.01)

(58) Field of Classification Search
CPC .............................. B60C 23/006; G01M 1/00
USPC ............... 702/19, 28, 34, 41, 179, 182, 183; 73/146; 703/2
See application file for complete search history.

(56) References Cited

U.S. PATENT DOCUMENTS

| 3,563,088 A | 2/1971 | Sperberg |
| 5,561,244 A | 10/1996 | Olesky et al. |

(Continued)

FOREIGN PATENT DOCUMENTS

| EP | 0794419 A1 | 9/1997 |
| EP | 1297975 B1 | 4/2010 |

(Continued)

OTHER PUBLICATIONS

Jae Yul Ann; International Search Report and Written Opinion for application No. PCT/US2013/073969; Mar. 24, 2014; pp. 1-11; Korean Intellectual Property Office; Daejeon Metropolitan City, Republic of Korea.

(Continued)

*Primary Examiner* — Gregory J Toatley
*Assistant Examiner* — Felix Suarez

(57) ABSTRACT

A method for reducing vehicle bias when testing a tire for use with a market segment of vehicles by creating a vehicle model that is scalable by vehicle weight. A market segment of vehicles is defined, at least one of a vehicle model parameter is defined, data is collected for the at least one vehicle model parameter from at least one vehicle in the market segment, the at least one vehicle model parameter is characterized through regression analysis as a function of total weight of a scalable vehicle model, the scalable vehicle model parameter is applied to a multibody vehicle dynamics simulation, at least one maneuver is applied to the scalable vehicle model, and the tire load histories generated by the multibody vehicle dynamics simulation are provided to a tire test machine to obtain tire wear data representative of the vehicles in the market segment.

7 Claims, 22 Drawing Sheets

(51) Int. Cl.
*G01B 5/10* (2006.01)
*G06F 1/22* (2006.01)
*B60C 99/00* (2006.01)
*G01M 17/02* (2006.01)
*G06F 17/50* (2006.01)

(56) References Cited

U.S. PATENT DOCUMENTS

| | | | |
|---|---|---|---|
| 7,778,809 B2* | 8/2010 | Miyashita et al. | 703/2 |
| 7,819,000 B2 | 10/2010 | Iwase | |
| 2002/0124638 A1 | 9/2002 | Turner et al. | |
| 2002/0134148 A1 | 9/2002 | Turner et al. | |
| 2003/0164036 A1* | 9/2003 | Giustino | 73/146 |
| 2004/0049303 A1 | 3/2004 | Levy et al. | |
| 2005/0066719 A1 | 3/2005 | Turner et al. | |
| 2007/0084276 A1 | 4/2007 | Matsuda et al. | |
| 2007/0260438 A1 | 11/2007 | Langer et al. | |
| 2008/0059134 A1 | 3/2008 | Miyashita et al. | |
| 2009/0281958 A1* | 11/2009 | Abidi et al. | 705/36 R |
| 2012/0186324 A1 | 7/2012 | Neugebauer et al. | |
| 2012/0245859 A1 | 9/2012 | Gerardin et al. | |

FOREIGN PATENT DOCUMENTS

| | | |
|---|---|---|
| EP | 1354184 B1 | 12/2010 |
| EP | 2267426 A2 | 12/2010 |
| EP | 2270463 A1 | 1/2011 |
| JP | 2002103930 A | 4/2002 |
| JP | 2004053482 A | 2/2004 |
| JP | 4076380 B2 | 4/2008 |
| JP | 4079703 B2 | 4/2008 |
| JP | 4836219 B2 | 12/2011 |
| JP | 2012006522 A | 1/2012 |
| JP | 2012006523 A | 1/2012 |
| WO | 02058947 A2 | 8/2002 |
| WO | 2002058947 A2 | 8/2002 |
| WO | 2006044407 A1 | 4/2006 |

OTHER PUBLICATIONS

Commissioner; International Search Report and Written Opinion for PCT patent application PCT/US2015/052113; Mar. 25, 2016; pp. 1-14; Korean Intellectual Property Office; Daejeon Metropolitan City, Republic of Korea.

* cited by examiner

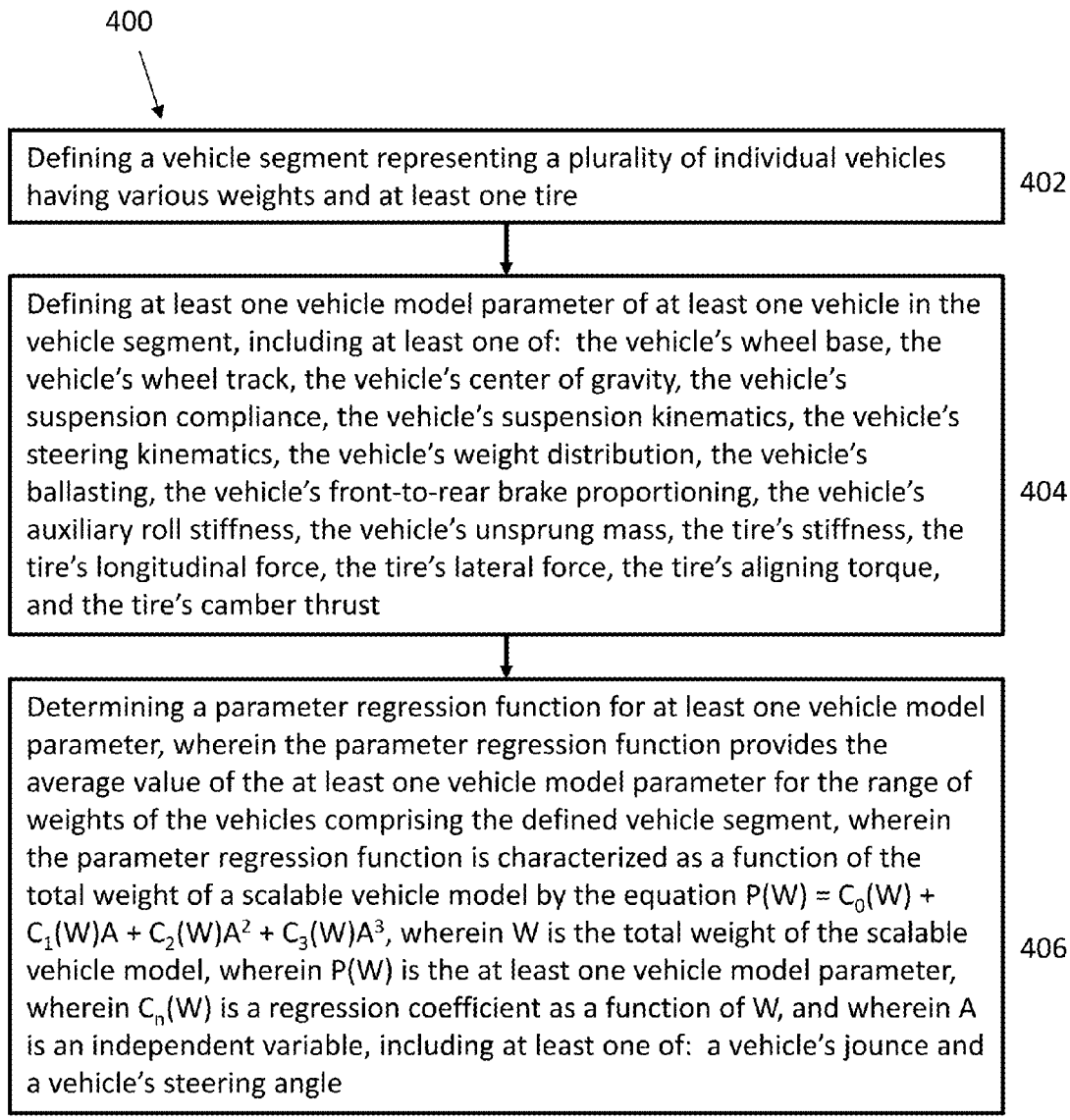

400

402 Defining a vehicle segment representing a plurality of individual vehicles having various weights and at least one tire 404 Defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning torque, and the tire's camber thrust 406 Determining a parameter regression function for at least one vehicle model parameter, wherein the parameter regression function provides the average value of the at least one vehicle model parameter for the range of weights of the vehicles comprising the defined vehicle segment, wherein the parameter regression function is characterized as a function of the total weight of a scalable vehicle model by the equation $P(W) = C_0(W) + C_1(W)A + C_2(W)A^2 + C_3(W)A^3$, wherein W is the total weight of the scalable vehicle model, wherein $P(W)$ is the at least one vehicle model parameter, wherein $C_n(W)$ is a regression coefficient as a function of W, and wherein A is an independent variable, including at least one of: a vehicle's jounce and a vehicle's steering angle

FIG. 4

| Vehicle component | Property | No. of parameters to be scaled |
|---|---|---|
| Exterior | Track | 1 |
| | Wheel base | 1 |
| Mass | Center of gravity | 1 |
| | Corner weight | 1 |
| Brake system | Front/rear brake allocation | 1 |
| Steering system | Steering kinematics (left/right) | 8 (4/4) |
| Suspension kinematics | Camber due to jounce (front/rear) | 8 (4/4) |
| | Toe due to jounce (front/rear) | 8 (4/4) |
| Suspension compliance | Suspension spring stiffness (front/rear) | 2 (1/1) |
| | Auxiliary roll moment (front/rear) | 2 (1/1) |
| | Toe due to $F_x$ (front/rear) | 2 (1/1) |
| | Steer due to $F_y$ (front/rear) | 2 (1/1) |
| | Steer due to $M_z$ (front/rear) | 2 (1/1) |
| | Camber due to $F_x$ (front/rear) | 2 (1/1) |
| | Inclination due to $F_y$ (front/rear) | 2 (1/1) |
| | Inclination due to $M_z$ (front/rear) | 2 (1/1) |
| | Longitudinal displacement due to $F_x$ (front/rear) | 2 (1/1) |
| | Lateral displacement due to $F_y$ (front/rear) | 2 (1/1) |
| Tire | Spring rate | 1 |
| | $F_x$ due to longitudinal slip | 1 |
| | $F_y$ due to slip angle | 1 |
| | Aligning torque due to slip angle | 1 |
| | Camber thrust | 4 |
| Total | | 57 |

FIG. 7

SCALABLE VEHICLE MODELS FOR INDOOR TIRE TESTING

CROSS-REFERENCE TO RELATED APPLICATIONS

This application is a continuation-in-part of U.S. Nonprovisional patent application Ser. No. 14/043,948, filed on Oct. 2, 2013, now published as U.S. 2014/0188406, and a continuation-in-part of PCT application PCT/US13/73969, now published as WO 2014/105409, both of which claim priority from U.S. Provisional Patent Application No. 61/746,913, filed on Dec. 28, 2012, each of which is incorporated by reference herein in its entirety.

BACKGROUND

Tire manufacturers often perform wear testing on tires. Tire tread wear may be influenced by a number of variables other than the tire construction and tread compound, such as: environmental factors (such as temperature and rain fall), driver severity (such as driving style and route composition), pavement characteristics, and tire and vehicle dynamic properties (such as weight, location of center of gravity, load transfer during maneuvers, steering kinematics, and the like). In order to accurately measure tire tread wear and make comparisons between various tire models, testing must be conducted in such a manner as to hold constant the influences from the environment, driver severity, pavement, and vehicle so as to not bias the tread wear results. Vehicle characteristics can have a significant effect on a tire's wear rate and cause an irregular wear propensity. As long as all tires in the test are evaluated on the same vehicle model, the bias introduced by the vehicle will be the same for all test tire models.

Some tires, such as original equipment manufacturer ("OEM") tires, are developed specifically for a particular vehicle. In this case, tire testing should be done on the specific OEM vehicle, or, if tested on an indoor tire test machine, the vehicle should be precisely simulated. However, many tires are designed as a replacement to worn or damaged OEM tires; these tires are referred to as "trade tires." Trade tires may not be developed specifically for one particular vehicle, but rather, for an entire market segment of vehicles comprising a large variety of tire sizes and respective load capacities. A variety of sizes and different tire load requirements will normally require testing on different vehicles, which may have different ballast conditions. When this is the case, the vehicle-to-vehicle bias and the test tires' wear performances are inseparable. For indoor tire testing, it is desirable to create a vehicle model that is "typical" of the vehicles in a certain segment (for example, front wheel drive sedans or pick-up trucks), and which is continuously scalable to different loads.

Contemporary practice for tire manufacturers, for example when testing trade tires for the National Highway Traffic Safety Administration's Uniform Tire Quality Grading ("UTQG") standard for relative grading of tires for tread wear, is to test each tire on some number of specific vehicles. For example, testing may be performed on an actual vehicle driving the 640 km UTQG road course in Texas. Testing may also be performed on an indoor tire test machine that is configured to apply to a test tire certain forces at certain inclination angles to simulate the forces and inclination angles the tire would see on the actual UTQG road course. This latter method typically involves less time and money than the former method. For example, an outdoor UTQG test may take more than two weeks to plan, prepare, and execute. By contrast, an indoor UTQG wear test may take less than one week to plan, prepare, and execute. Moreover, an outdoor UTQG test may require a team of people dedicated to the test, whereas an indoor UTQG wear test may be run by one person on an automated tire wear test machine. Regardless of which testing method is chosen, the contemporary practice has been to test a tire on a specific vehicle to obtain that tire's tread wear rating on that vehicle. The goal for this method is to develop tire wear tests that produce the most accurate results possible for a particular vehicle. Tire manufacturers then use this wear rating on their tires to be used on many different vehicles within a market segment. However, due to vehicle bias, there can be significant variation between a tire's tread wear rating and the actual tread life it will experience when mounted to a vehicle on which it was not tested. Such discrepancies may lead to consumer frustration and dissatisfaction, either in the tire or in the tire manufacturer, because the actual tire wear mileage observed may be far less than the tire wear mileage indicated by the tire's UTQG wear rating.

What is needed is a low cost method for testing tires that allows for a more accurate tire wear rating across a wider variety of vehicles, resulting in higher consumer confidence and satisfaction. Tire testing systems and methods are needed to permit indoor simulation testing of tires of a wide range of sizes on a scalable vehicle model ("SVM"), which would alleviate the need for testing tires on multiple vehicles and which would permit the measurement of tire wear and performance without vehicle-to-vehicle bias.

SUMMARY

In one embodiment, a method for creating a SVM for tire design and testing is provided, the method comprising: defining a vehicle segment representing a plurality of individual vehicles having various weights and at least one tire; defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning moment, and the tire's camber thrust; determining a parameter regression function for at least one vehicle model parameter, wherein the parameter regression function provides the average value of the at least one vehicle model parameter for the range of weights of the vehicles comprising the defined vehicle segment, wherein the parameter regression function is characterized as a function of the total weight of a SVM by the equation $P(W) = C_0(W) + C_1(W)A + C_2(W)A^2 + C_3(W)A^3$, wherein W is the total weight of the SVM, wherein $P(W)$ is the at least one vehicle model parameter, wherein $C_n(W)$ is a regression coefficient as a function of W, and wherein A is an independent variable, including at least one of: a vehicle's jounce and a vehicle's steering angle. In one embodiment, $C_n(W)$ is equal to $a_{n0} + a_{n1}W + a_{n2}W^2 + a_{n3}W^3$. In another embodiment, the method may further comprise creating a SVM as a function of W. In another embodiment, the method may further comprise creating at least one formula comprising a regression curve fit of a tire load as a function of W. In another embodiment, the method may further comprise: developing a coefficient model, wherein the coefficient model characterizes one of a cornering coefficient, a slip stiffness coefficient, and an aligning torque coefficient, wherein the coefficient model is a function of W and a vertical load exerted on a tire; determining a total weight dependency of the coefficient model through a coefficient regression function, wherein the coefficient regression function is a function of W; and developing a scalable vehicle model of at least one of: a tire lateral force, a tire longitudinal force, and a tire aligning moment, wherein the scalable vehicle model is a function of a slip angle and the vertical force exerted on the tire. In one embodiment, the coefficient regression function may be a bi-linear function. In one embodiment, the scalable vehicle model may be modeled as a cubic spline function.

In another embodiment, a method for predicting at least one of a tire force and an inclination angle exerted on a tire by a vehicle in a particular vehicle segment is provided, the method comprising: defining a vehicle segment representing a plurality of individual vehicles having various weights and at least one tire; defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning torque, and the tire's camber thrust; determining a parameter regression function for at least one vehicle model parameter, wherein the parameter regression function provides the average value of the at least one vehicle model parameter for the range of weights of the vehicles comprising the defined vehicle segment, wherein the parameter regression function is characterized as a function of the total weight of a SVM by the equation $P(W)=C_0(W)+C_1(W)A+C_2(W)A^2+C_3(W)A^3$, wherein W is the total weight of the SVM, wherein P(W) is the at least one vehicle model parameter, wherein $C_n(W)$ is a regression coefficient as a function of W, wherein A is an independent variable, including at least one of: a vehicle's jounce and a vehicle's steering angle; and predicting at least one of a tire force and an inclination angle exerted on a tire by the SVM through a multibody vehicle dynamics simulation. In one embodiment, $C_n(W)$ is equal to $a_{n0}+a_{n1}W+a_{n2}W^2+a_{n3}W^3$. In another embodiment, the method may further comprise applying the SVM to at least one maneuver in the multibody vehicle dynamics simulation to determine at least one of: a longitudinal acceleration and a deceleration, a lateral acceleration, a steering angle, an inclination angle, and a tire loading history for each tire of the SVM. In another embodiment, the method may further comprise creating a SVM as a function of W. In another embodiment, the method may further comprise creating at least one formula comprising a regression curve fit of a tire load as a function of W. In another embodiment, the method may further comprise: developing a coefficient model, wherein the coefficient model characterizes one of a cornering coefficient, a slip stiffness coefficient, and an aligning torque coefficient, wherein the coefficient model is a function of W and a vertical load exerted on a tire; determining a total weight dependency of the coefficient model through a coefficient regression function, wherein the coefficient regression function is a function of W; and developing a scalable vehicle model of at least one of: a tire lateral force, a tire longitudinal force, and a tire aligning moment, wherein the scalable vehicle model is a function of a slip angle and the vertical force exerted on the tire. In one embodiment, the coefficient regression function may be a bi-linear function. In one embodiment, the scalable vehicle model may be modeled as a cubic spline function.

In another embodiment, a method for determining the wear rate of a tire for use with a particular vehicle segment is provided, the method comprising: defining a vehicle segment representing a plurality of individual vehicles having various weights and at least one tire; defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning moment, and the tire's camber thrust; determining a parameter regression function for at least one vehicle model parameter, wherein the parameter regression function provides the average value of the at least one vehicle model parameter for the range of weights of the vehicles comprising the defined vehicle segment, wherein the parameter regression function is characterized as a function of the total weight of a SVM by the equation $P(W)=C_0(W)+C_1(W)A+C_2(W)A^2+C_3(W)A^3$, wherein W is the total weight of the SVM, wherein P(W) is the at least one vehicle model parameter, wherein $C_n(W)$ is a regression coefficient as a function of W, wherein A is an independent variable, including at least one of: a vehicle's jounce and a vehicle's steering angle; predicting at least one of a tire force and an inclination angle exerted on a tire by the SVM through a multibody vehicle dynamics simulation; and determining the wear rate of a tire by mounting the tire on a machine, wherein the machine is configured to rotate the tire at a desired speed and to apply the tire against a simulated road surface with at least one of: the predicted tire force and the predicted inclination angle, wherein the machine is placed into operation, and wherein the wear of the tire is measured over time. In one embodiment, $C_n(W)$ is equal to $a_{n0}+a_{n1}W+a_{n2}W^2+a_{n3}W^3$. In another embodiment, the method may further comprise applying the SVM to at least one maneuver in the multibody vehicle dynamics simulation to determine at least one of: a longitudinal acceleration and a deceleration, a lateral acceleration, a steering angle, an inclination angle, and a tire loading history for each tire of the SVM. In another embodiment, the method may further comprise creating at least one formula comprising a regression curve fit of a tire load as a function of W. In another embodiment, the method may further comprise: developing a coefficient model, wherein the coefficient model characterizes one of a cornering coefficient, a slip stiffness coefficient, and an aligning torque coefficient, wherein the coefficient model is a function of W and a vertical load exerted on a tire; determining a total weight dependency of the coefficient model through a coefficient regression function, wherein the coefficient regression function is a function of W; and developing a scalable vehicle model of at least one of: a tire lateral force, a tire longitudinal force, and a tire aligning moment, wherein the scalable vehicle model is a function of a slip angle and the vertical force exerted on the tire. In one embodiment, the coefficient regression function may be a bi-linear function. In one embodiment, the scalable vehicle model may be modeled as a cubic spline function.

BRIEF DESCRIPTION OF THE DRAWINGS

The accompanying figures, which are incorporated in and constitute a part of the specification, illustrate various example methods, data sets, and results and are used merely to illustrate various example embodiments. In the figures, like elements bear like reference numerals.

FIG. 4 illustrates an example method 400 for creating a SVM for tire design and indoor tire testing.

FIG. 7 illustrates a set of vehicle model parameters that are scalable by weight.

DETAILED DESCRIPTION

Figure 1:
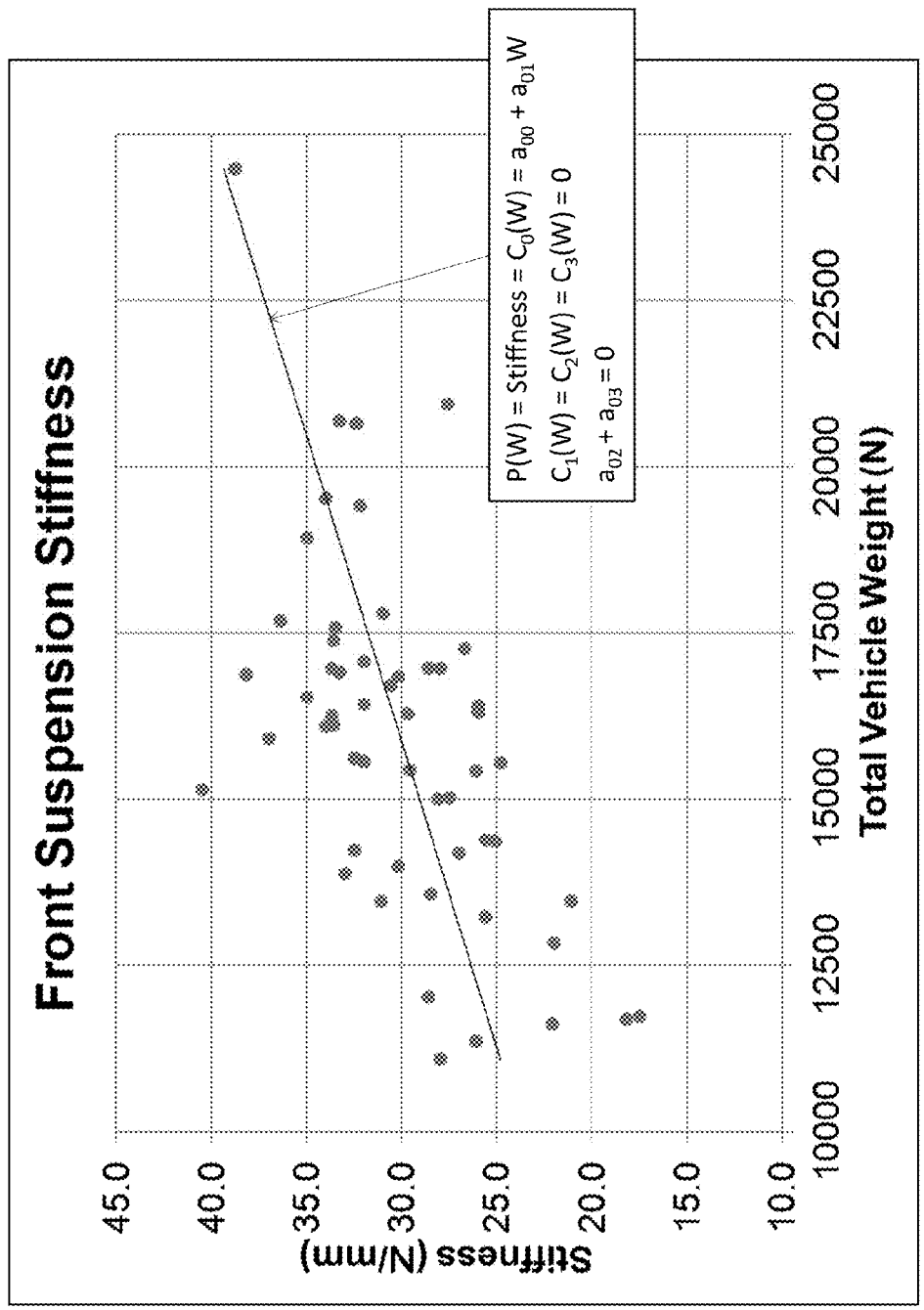
FIG. 1 illustrates example results following P(W) regression analysis of a data set.

A trade tire may be configured to fit a segment of vehicles, having a range of weights, rim sizes, suspension geometry, steering geometry, and the like. The trade tire may be optimized to provide the best wear characteristics for the segment of vehicles.

Testing of the trade tire on an actual vehicle, in accordance with contemporary practice, causes vehicle bias to affect the test results. That is, if the tire is tested on vehicle A, vehicle A's weight, rim size, suspension geometry, steering geometry, and the like may affect the tire's wear performance differently from vehicle B.

A SVM differs from any particular vehicle in that the SVM represents something that does not exist in physical form. In other words, there may be no particular vehicle that has the same parameters values as the SVM. Rather, the SVM represents an average vehicle for the entire vehicle segment. In many ways then, the SVM is a fictitious vehicle that reflects the general characteristics of the vehicle segment as a whole, while being gradually and continuously scalable. The SVM may thus may be used in place of any of the various vehicles in a vehicle segment. Substitution of a SVM for vehicle A, vehicle B, and the like acts to remove vehicle bias from trade tire indoor testing and eliminates a need for actual testing of the trade tire on each individual vehicle A, vehicle B, and the like. Instead, the trade tire may be tested on an indoor tire wear test machine, which may be configured to simulate many various vehicle weights within a vehicle segment.

A vehicle segment may be defined in any number of ways. For example, vehicle segments may be selected from existing vehicle segments, such as consumer market-driven segments, or created in any manner that groups vehicles into segments that have some similarity that is relevant to the person or people defining the vehicle segment, such as performance-driven or design-driven vehicle segments. Possible vehicle segments may include, for example, rear-wheel drive ("RWD") pickup trucks, front-wheel drive ("FWD") sedans, and large sport utility vehicles ("SUVs"). In one embodiment, specific ballasting conditions, such as those used by the UTQG wear test, may constitute a unique segment. UTQG test requirements may vary across vehicle segments. For example, RWD pickup trucks may require 50%/50% front to rear ballasting. As another example, FWD sedans may require curb plus driver ballasting. In one embodiment, any of various vehicle segments may be created and analyzed. In another embodiment, vehicle segments may be created based upon the intended vehicles upon which any of a variety of trade tires may be applied. In one embodiment, the various vehicles of a vehicle segment may have various weights.

Following the definition of a particular vehicle segment representing a plurality of vehicles having various weights and at least one tire, one may define at least one vehicle model parameter. Vehicle model parameters correspond to characteristics inherent in vehicles, although not all such characteristics are scalable by weight. FIG. 7 illustrates the vehicle parameters (i.e. characteristics inherent in a vehicle) that are scalable by weight. Defining a vehicle model parameter may include selecting at least one vehicle model parameter and collecting the corresponding physical data from at least one vehicle in the defined vehicle segment. Accordingly, vehicle model parameters may be defined, and therefore data may be collected regarding various characteristics inherent in a vehicle, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning moment, and the tire's camber thrust. In one embodiment, at least the following vehicle model parameters are defined: the vehicle's wheel base, the vehicle's wheel track, the vehicle's center of gravity, the vehicle's suspension stiffness, the vehicle's suspension kinematics, the vehicle's steering kinematics, the vehicle's front-to-rear weight distribution, the vehicle's front-to-rear brake split, the vehicle's auxiliary roll stiffness, the vehicle's unsprung mass, the stiffness of a tire on the vehicle, the longitudinal force of a tire on the vehicle, the lateral force of a tire on the vehicle, the aligning moment of a tire on the vehicle, and the camber thrust of a tire on the vehicle.

In one embodiment, various of the at least one vehicle model parameters are fixed between vehicles when developing the SVM. These model parameters may include: vehicle weight distribution, front-to-rear brake split, and suspension static alignment.

In one embodiment, various of the at least one vehicle model parameters are scalable between vehicles when developing the SVM. The model parameters may include: wheel base, wheel track, center of gravity, suspension stiffness, roll stiffness, suspension kinematics, and tire stiffness.

In one embodiment, each vehicle of the selected vehicle segment is analyzed with respect to at least one vehicle model parameter relative to the vehicle's total weight. Data regarding the vehicle parameters to be analyzed may be collected from the vehicles within a particular market segment in various ways. For example, testing of FWD sedans may be conducted using a plurality of different vehicles with various characteristics. The measurements taken of each vehicle may include without limitation, wheel base and track dimensions, load distribution, steering kinematics, and suspension compliances and kinematics. In addition, each vehicle may be driven over floor mounted force platforms following predetermined paths at various levels of deceleration and acceleration. Front-to-rear brake distributions and load transfer coefficients may be determined using these force platform measurements. The load transfer coefficients may be used to estimate the height of vehicle center of gravity, since center of gravity height was not measured directly. Since vehicle inertia and shock absorbers have relatively little influence on the vehicle load transfer behavior for the type of maneuvers simulated, vehicle moments and products of inertia and shock absorbers may not be measured and scaled for the SVM.

Once data regarding the vehicle parameters has been collected, the data may be input into a computer configured to operate regression analysis software. In one embodiment, regression analysis software is available from Microsoft Corporation of Redmond, Wash. under the name Excel®. In one embodiment, regression analysis software is available from NCSS, LLC of Kaysville, Utah under the name NCSS9®. In one embodiment, regression analysis software may be any software configured to operate on a computer and capable of storing data points in at least two dimensions, plotting those data points on a chart or graph, and fitting a curve to the data points so as to represent the data points as a single equation relating the dependent variable (e.g. vehicle parameter) to the independent variable (e.g. vehicle weight). In one embodiment, the regression analysis software may be capable of determining a regression function which calculates the average value of the dependent variable for a range of independent variables.

FIG. 1 illustrates example results following regression analysis of a data set. The data set illustrates front suspension stiffness versus total vehicle weight. Each point indicated in the example data set represents a vehicle of the vehicle segment, and its total vehicle weight. For example, FIG. 1 indicates a vehicle comprising a total vehicle weight of approximately 12,000 N (2,698 lbf), with a front suspension stiffness of approximately 28.0 N/mm (160 lbf/in). In another example, FIG. 1 indicates a vehicle comprising a total vehicle weight of approximately 24,500 N (5,508 lbf), with a front suspension stiffness of approximately 39.0 N/mm (223 lbf/in). The suspension stiffness of a vehicle may play a role in the amount of force experienced in that vehicle's tire during operation.

The front suspension stiffness data is applied to regression analysis to create a SVM suspension stiffness illustrated as the line representing P(W). In one embodiment, the line representing P(W) is used in a SVM to estimate the suspension stiffness of the SVM at any of various weights from 11,615 N (2,611 lbf) to 20,835 N (4,684 lbf).

Figure 2:
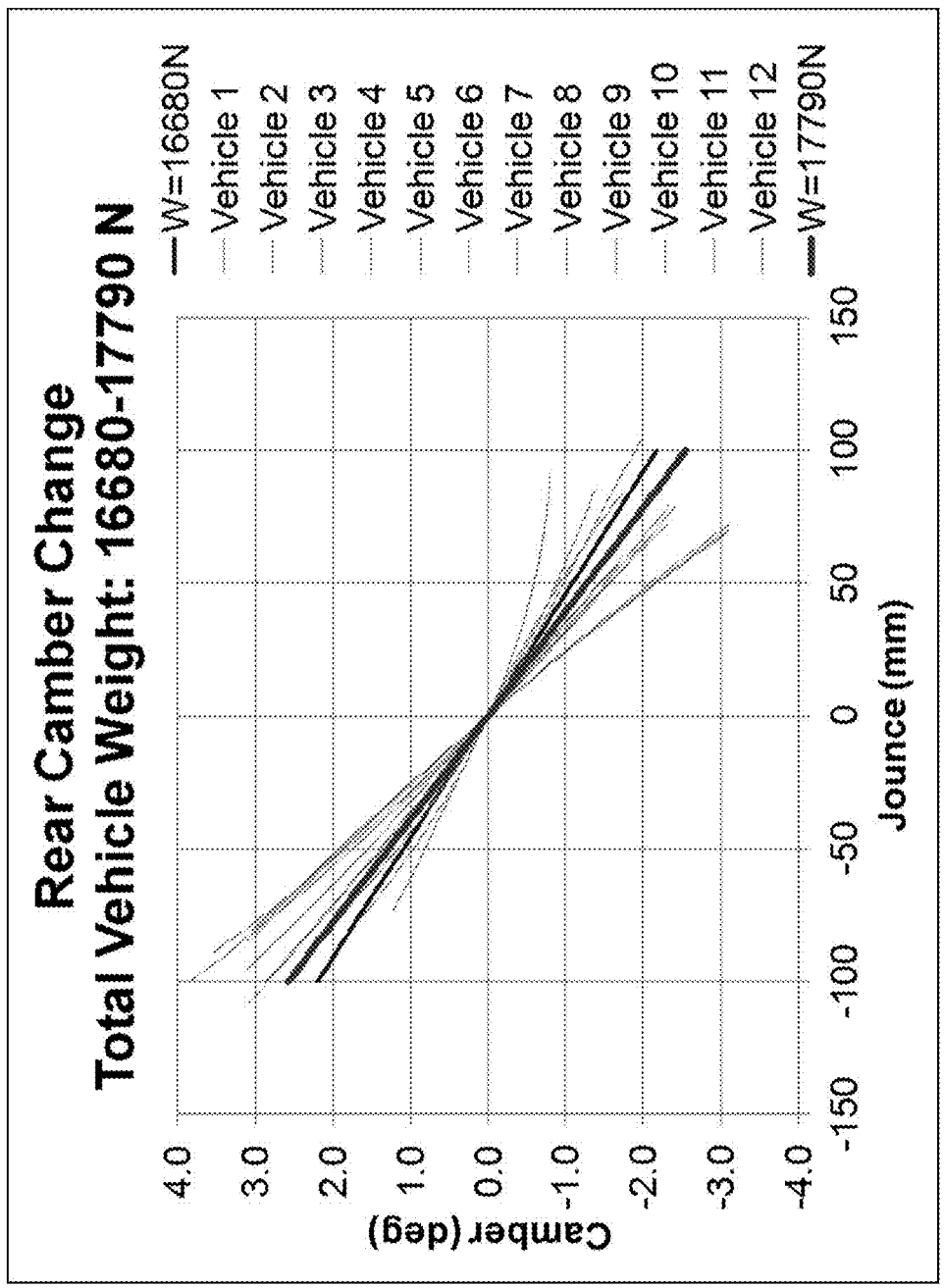
FIG. 2 illustrates example results following P(W) regression analysis of a data set.

FIG. 2 illustrates example results following regression analysis of a data set. The data set illustrates rear camber change versus jounce in a variety of vehicles in a vehicle segment. Each line indicated in the example data set represents a vehicle of the vehicle segment, and the relationship of its rear camber to its jounce. Each vehicle's rear camber is approximately 0.0 degrees when that vehicle's jounce is approximately 0.0 mm (0.0 in). For example, FIG. 2 indicates that a Vehicle 6 has a rear camber of approximately −1.0 degree when its jounce is approximately 50.0 mm (2.0 in). The rear camber of a vehicle may play a role in the inclination angle experienced in that vehicle's tire during operation.

In one embodiment, the at least one vehicle model parameter is characterized through regression analysis as a function of the total weight of the SVM ("W"). In one embodiment, the at least one vehicle model parameter is characterized through regression analysis using the equation $P(W)=C_0(W)+C_1(W)A+C_2(W)A^2+C_3(W)A^3$. $P(W)$ may be the at least one vehicle model parameter. $C_n(W)$ may be a regression coefficient as a function of W, and is equal to $a_{n0}+a_{n1}W+a_{n2}W^2+a_{n3}W^3$. A may be an independent variable, including at least one of: a vehicle's jounce and a vehicle's steering angle.

The rear camber change versus jounce data may be applied to regression analysis to create a SVM rear camber change illustrated as a series of lines representing P(W). Each line representing P(W) pertains to a specific vehicle weight. In one embodiment, a line representing P(W) for a specific vehicle weight is used to estimate the relationship between rear camber change in jounce in a SVM of that weight.

In one embodiment, each of the at least one vehicle model parameter is characterized through regression analysis in the same manner as either the front suspension stiffness data illustrated in FIG. 1 or the rear camber change versus jounce data illustrated in FIG. 2.

Figure 3:
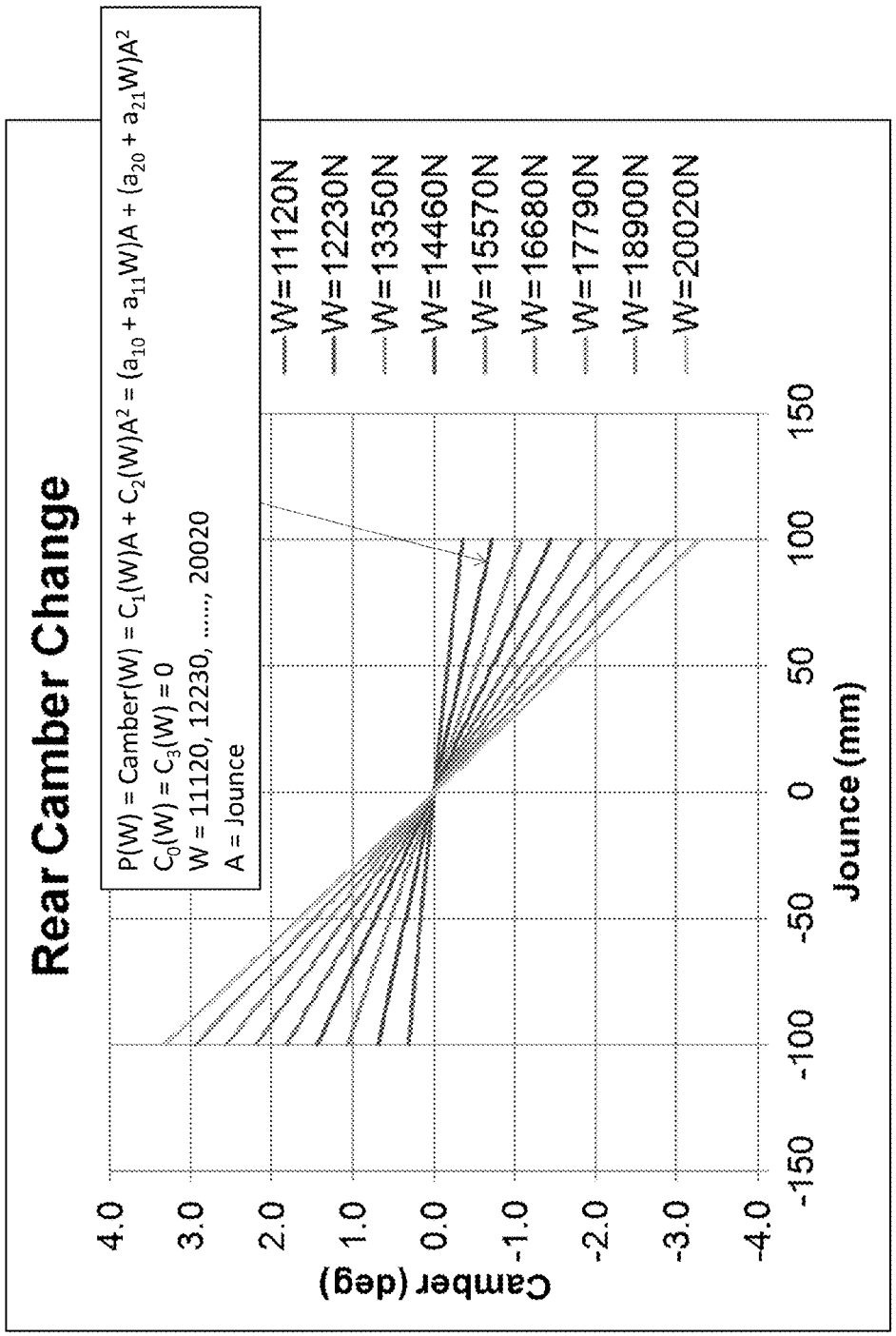
FIG. 3 illustrates example results following P(W) regression analysis of a data set.

FIG. 3 illustrates example results following regression analysis of the data set illustrated in FIG. 2. FIG. 3 illustrates regression lines for SVMs weighing between 16,680 N (3,750 lbf) and 17,790 N (4,000 lbf) plotted with pre-regression analysis rear camber change versus jounce in a variety of vehicles in a vehicle segment. The regression lines represent P(W) and permit a scalable linear predictability for determining rear camber versus jounce in a SVM.

Figure 8:
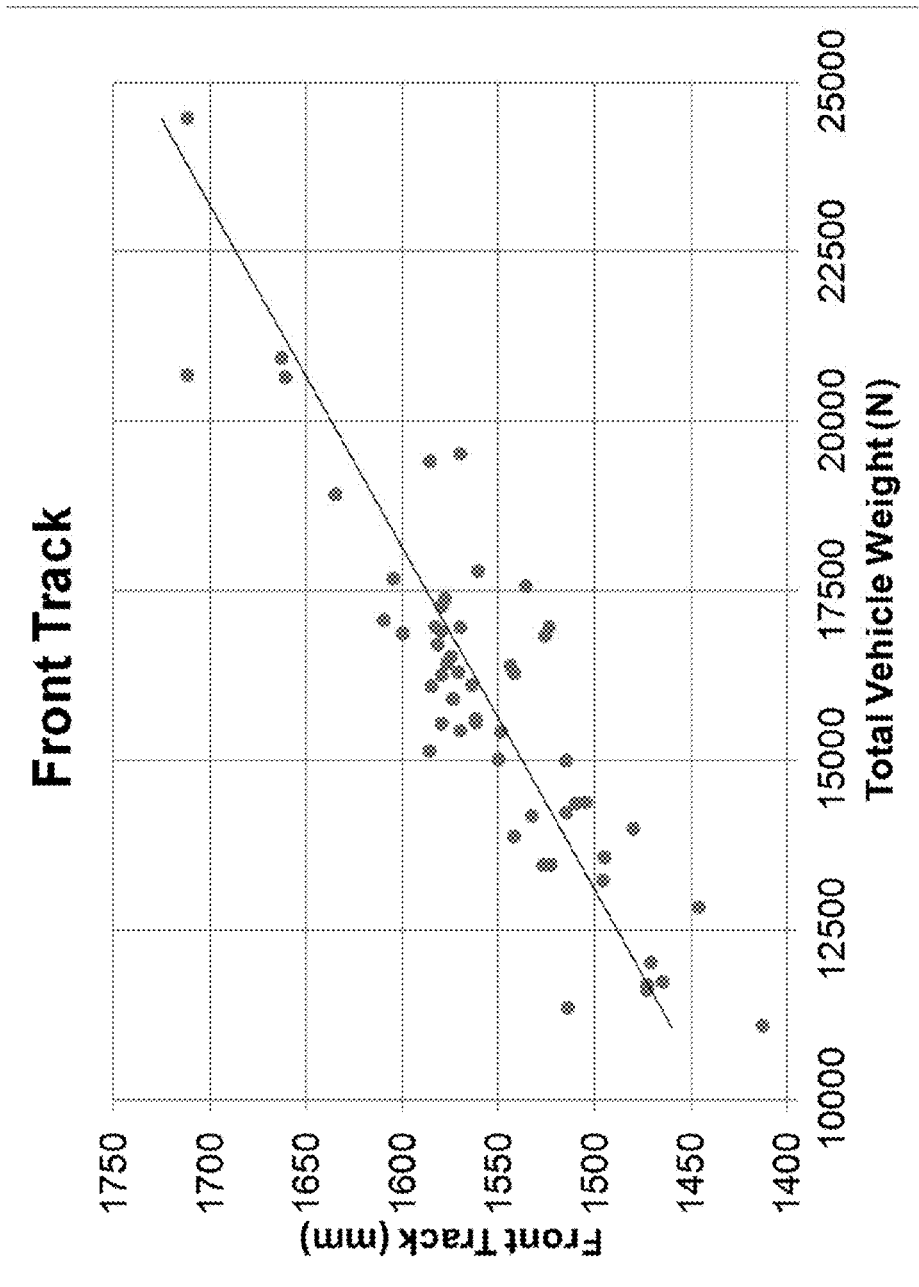
FIG. 8 illustrates example results following P(W) regression analysis of a data set.
Figure 9:
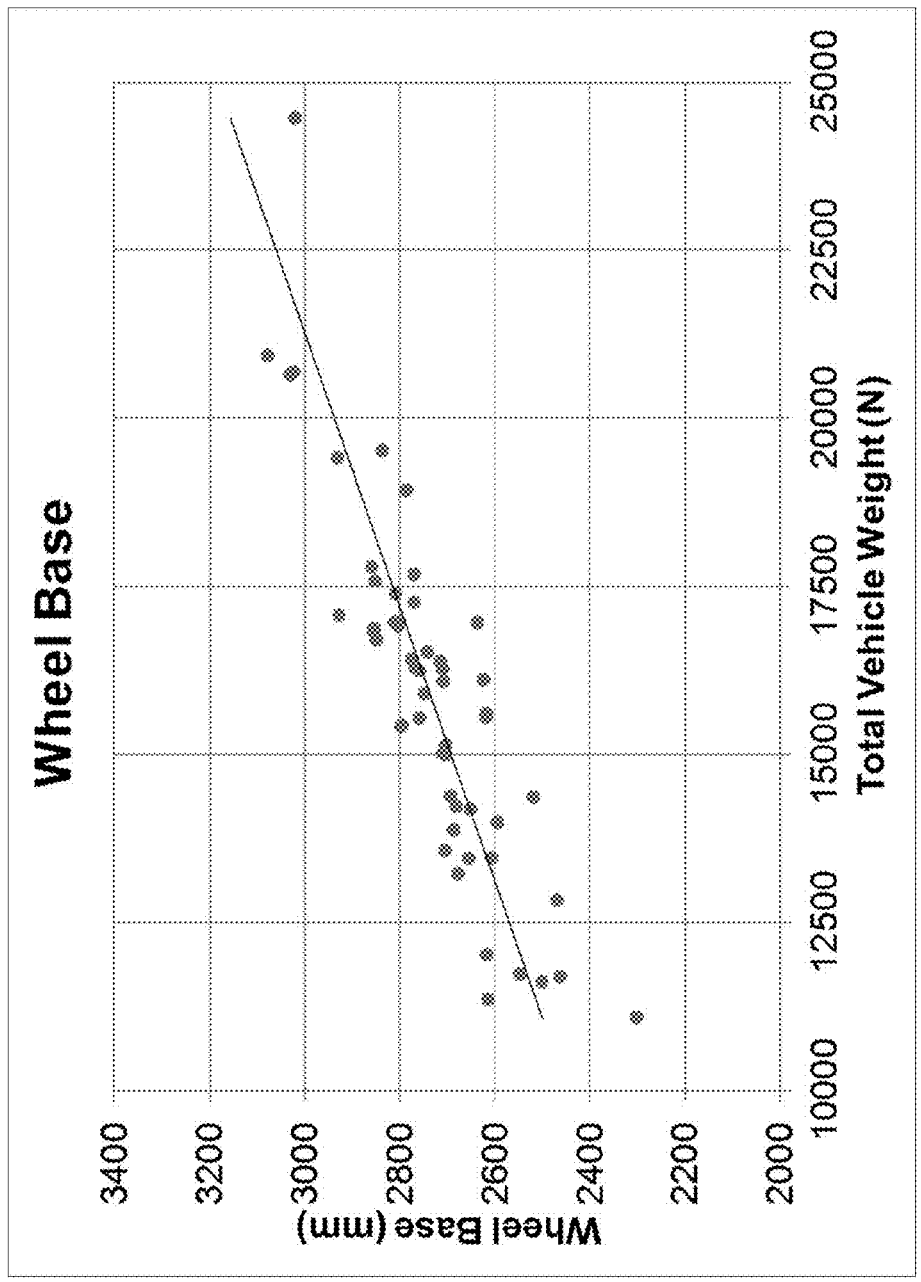
FIG. 9 illustrates example results following P(W) regression analysis of a data set.

In one embodiment, a vehicle's front axle load was found to be approximately 60% of total vehicle weight across the entire range of 52 vehicles. In this case $C_1(W)$, $C_2(W)$, and $C_3(W)$ were zero and $C_0(W)$ reduced to $a_{00}=0.60$. Other examples include the track and the wheel base as shown in both FIG. 8 and FIG. 9, respectively. Vehicle track and wheel base models may be treated as linear functions of total vehicle weight only. Thus, $P(W)=C_0(W)=a_{00}+a_{01}W$. For the track model, $a_{00}=1240$ and $a_{01}=0.088$, and for wheel base model, $a_{00}=1255$ and $a_{01}=0.218$.

Following the characterization of at least one vehicle model parameter as a function of W, a computer configured to operate a multibody vehicle dynamics simulation software package may be used to predict at least one of a tire force and an inclination angle of at least one tire. A computer configured in such a manner may transform the input data, which includes the characterization of at least one vehicle model parameter as a function of W, to the output data, which includes tire loading histories consisting of, without limitation, tire force and inclination angle data. In one embodiment, a multibody vehicle dynamics simulation software package ("MBVDSS") is available from Mechanical Simulation Corporation of Ann Arbor, Mich., under the name "CarSim®." In another embodiment, the MBVDSS is any commercially available or proprietary multibody vehicle dynamics simulation software, including without limitation, MSC Adams®, available from MSC Software Corporation of Newport Beach, Calif.; and SimCreator®, available from Realtime Technologies, Inc. of Royal Oak, Mich. In one embodiment, the MBVDSS is any software configured to operate on a computer and transform the input data, which includes the characterization of at least one vehicle model parameter as a function of W, into output data, which includes tire loading histories consisting of, without limitation, tire force and inclination angle data.

In one embodiment, the input of the at least one vehicle model parameter as a function of W into the MBVDSS may be used to develop discrete SVMs with scalable vehicle attributes at a set of representative weights. In another embodiment, the input of the at least one vehicle model parameter as a function of W into the MBVDSS may be used to develop discrete SVMs with scalable vehicle attributes at a set of representative corner loads.

The vehicle models created using the SVM approach may be intended for indoor wear and durability applications, as opposed to handling, ride, heavy braking, crash, and noise applications. Vehicle maneuvers associated with the wear and durability applications may be quasi-static in nature with limited acceleration and deceleration levels, generally not exceeding about 0.5 g. Therefore, vehicle inertia and shock absorbers may have relatively little influence on the vehicle load transfer behavior and suspension spring rate and other compliances may be linearized. It is also assumed that the CarSim® MBVDSS internal tire model combined slip predictions from pure cornering and pure braking force and moment are sufficiently accurate. Vehicles may be assumed to have fully independent suspensions.

In one embodiment, the SVM is represented in the MBVDSS, and the SVM is simulated in a suite of standard maneuvers to provide results for indoor UTQG wear modeling on a wear test drum. In another embodiment, the SVM is applied to at least one maneuver in the MBVDSS to determine at least one of: a longitudinal acceleration and a deceleration, a lateral acceleration, a steering angle, an inclination angle, and a tire loading history. A tire loading history for each tire of the SVM may be created based upon the application of the SVM to at least one maneuver in the MBVDSS. Tire loading histories may include at least one of a radial, a lateral, and a longitudinal force, and a camber of a tire. Tire loading histories may be provided to the input of laboratory tire testing machines or tire models. Laboratory testing machines may include accelerated indoor wear testing machines used to predict the wear performance of the tire when used by consumers. Tire models may include finite element analysis ("FEA") models. Following the application of the SVM to at least one maneuver in the MBVDSS, one may create at least one formula for a tire force and inclination angle per a tire position on the SVM.

In one embodiment, the at least one formula may be used to drive an indoor tire test machine. The indoor tire test machine may test the tire for at least one of durability and wear. In another embodiment, the at least one formula may be used to provide information for a FEA.

In one embodiment, the SVM is characterized by measuring the three directional forces ($F_x$, $F_y$, and $F_z$) and inclination angles experienced by each of the tires during the at least one simulated maneuver. Force $F_x$ is the fore-aft force applied to the tire at its contact patch parallel to its direction of rotation. Force $F_y$ is the lateral force applied to the tire at its contact patch perpendicular to its direction of rotation. Force $F_z$ is the vertical force applied to the tire at its contact patch.

In one embodiment, the SVM is characterized by measuring the accelerations ($A_x$ and $A_y$) and velocity ($V_x$) of the vehicle when the three directional forces and inclination angles are measured. Acceleration $A_x$ is the fore-aft acceleration of the vehicle. Acceleration $A_y$ is the lateral acceleration of the vehicle. Velocity $V_x$ is the fore-aft velocity of the vehicle.

In one embodiment, formulas are created that relate the vehicle accelerations $A_x$ and $A_y$ and velocity $V_x$ to the three directional forces $F_x$, $F_y$, and $F_z$ and inclination angles experienced by each of the tires. In one embodiment, the formulas are $F_x=f_1(A_x, A_y, V_x)$; $F_y=f_2(A_x, A_y, V_x)$; $F_z=f_3(A_x, A_y, V_x)$; and $IA=f_4(A_x, A_y, V_x)$.

In one embodiment, the fore-aft acceleration $A_x$ and lateral acceleration $A_y$ experienced by the SVM in the at least one simulated maneuver is measured. In another embodiment, the fore-aft velocity $V_x$ of the SVM in the at least one simulated maneuver is measured.

In one embodiment, one predicts the force data and inclination angle that represents forces and inclination angles that would be experienced by the SVM if the SVM were driven through additional maneuvers, simulated or real. In one embodiment, the fore-aft acceleration $A_x$, lateral acceleration, $A_y$, and fore-aft velocity $V_x$ of the SVM in the at least one simulated maneuver is substituted for vehicle accelerations $A_x$, $A_y$, and velocity $V_x$ in the formulas $F_x=f_1(A_x, A_y, V_x)$; $F_y=f_2(A_x, A_y, V_x)$; $Fz=f_3(A_x, A_y, V_x)$; and $IA=f_4(A_x, A_y, V_x)$ for any chosen SVM tire.

Figure 10:
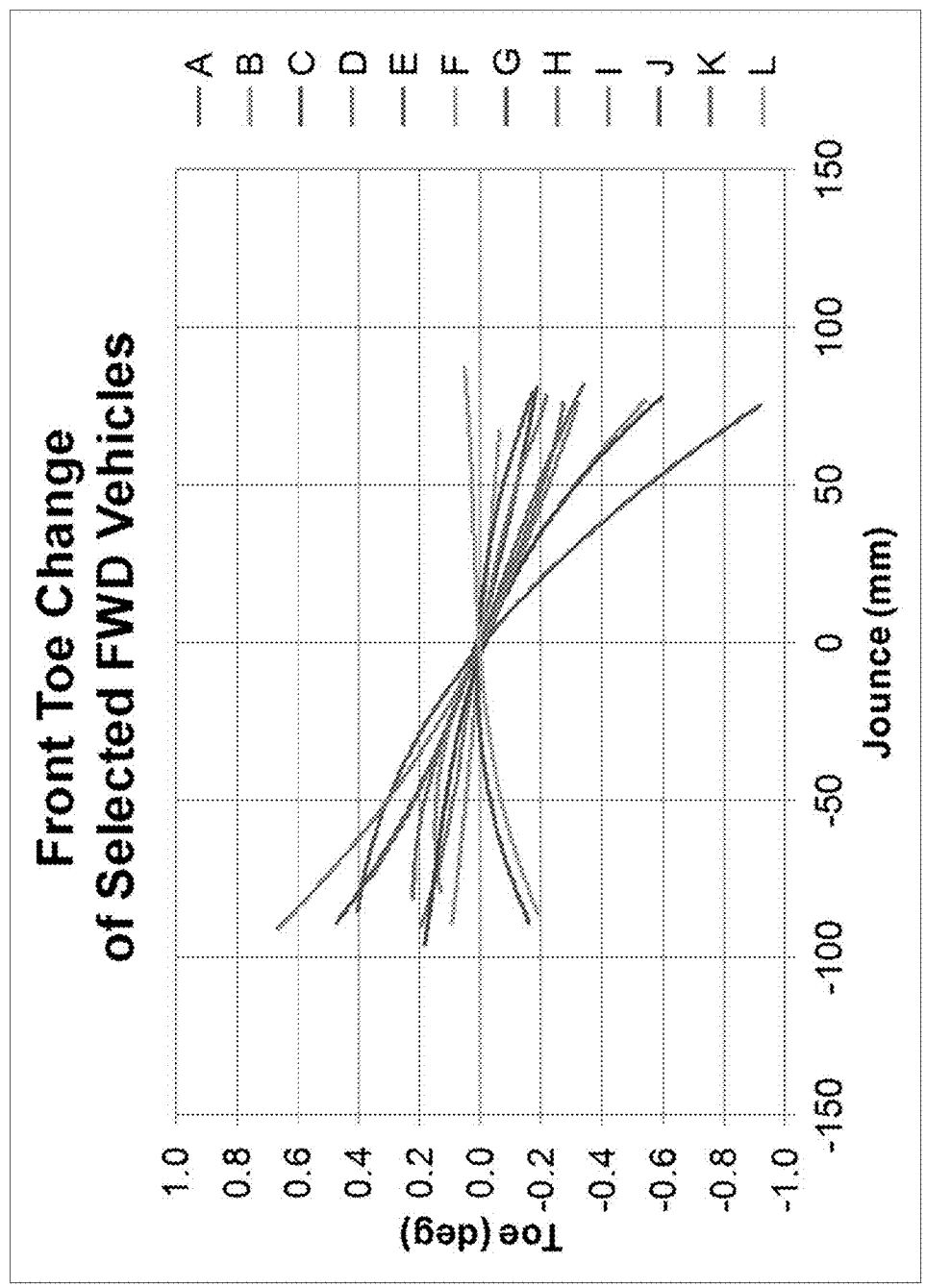
FIG. 10 illustrates example results following P(W) regression analysis of a data set.
Figure 11:
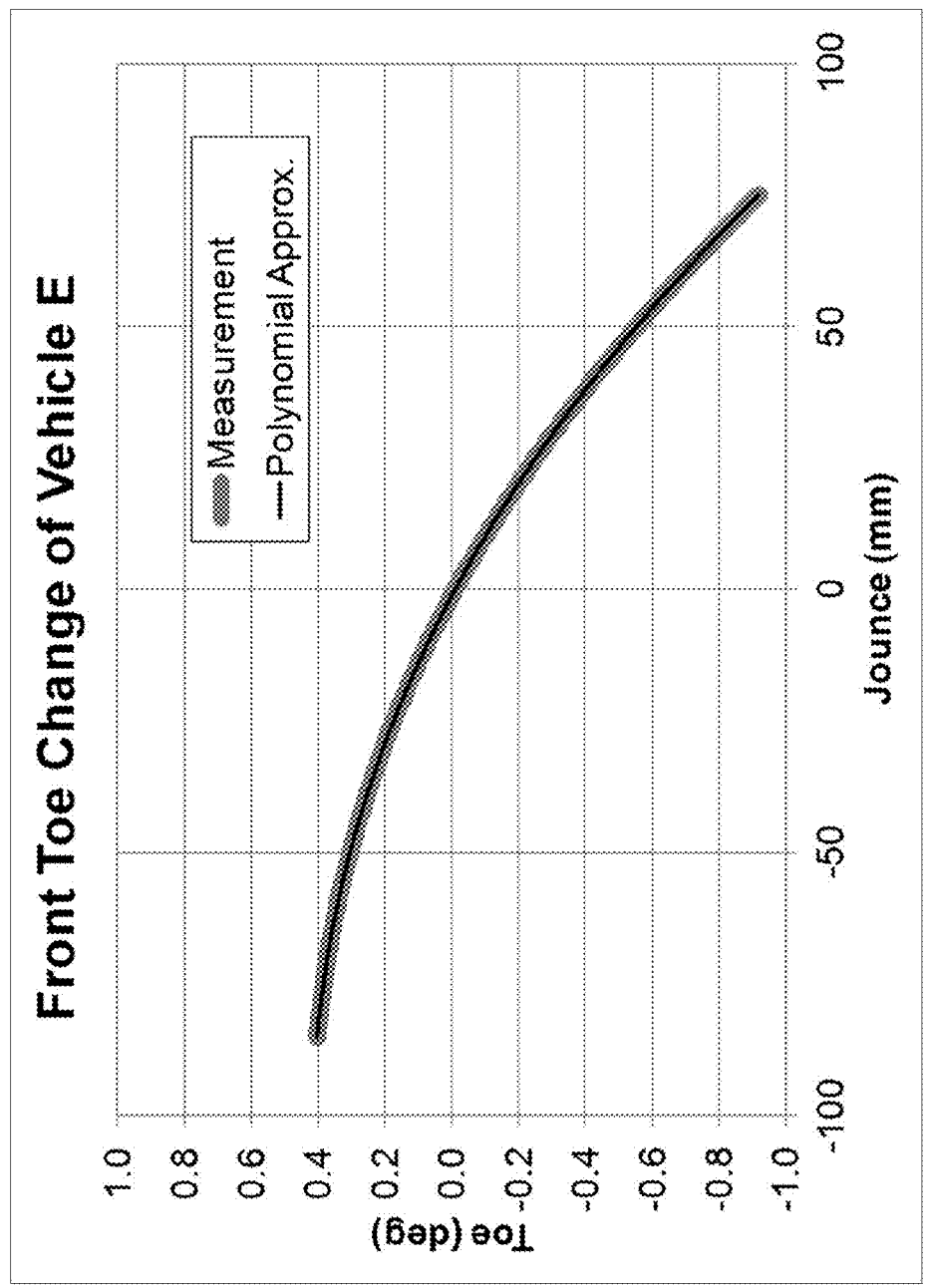
FIG. 11 illustrates example results following P(W) regression analysis of a data set.
Figure 12:
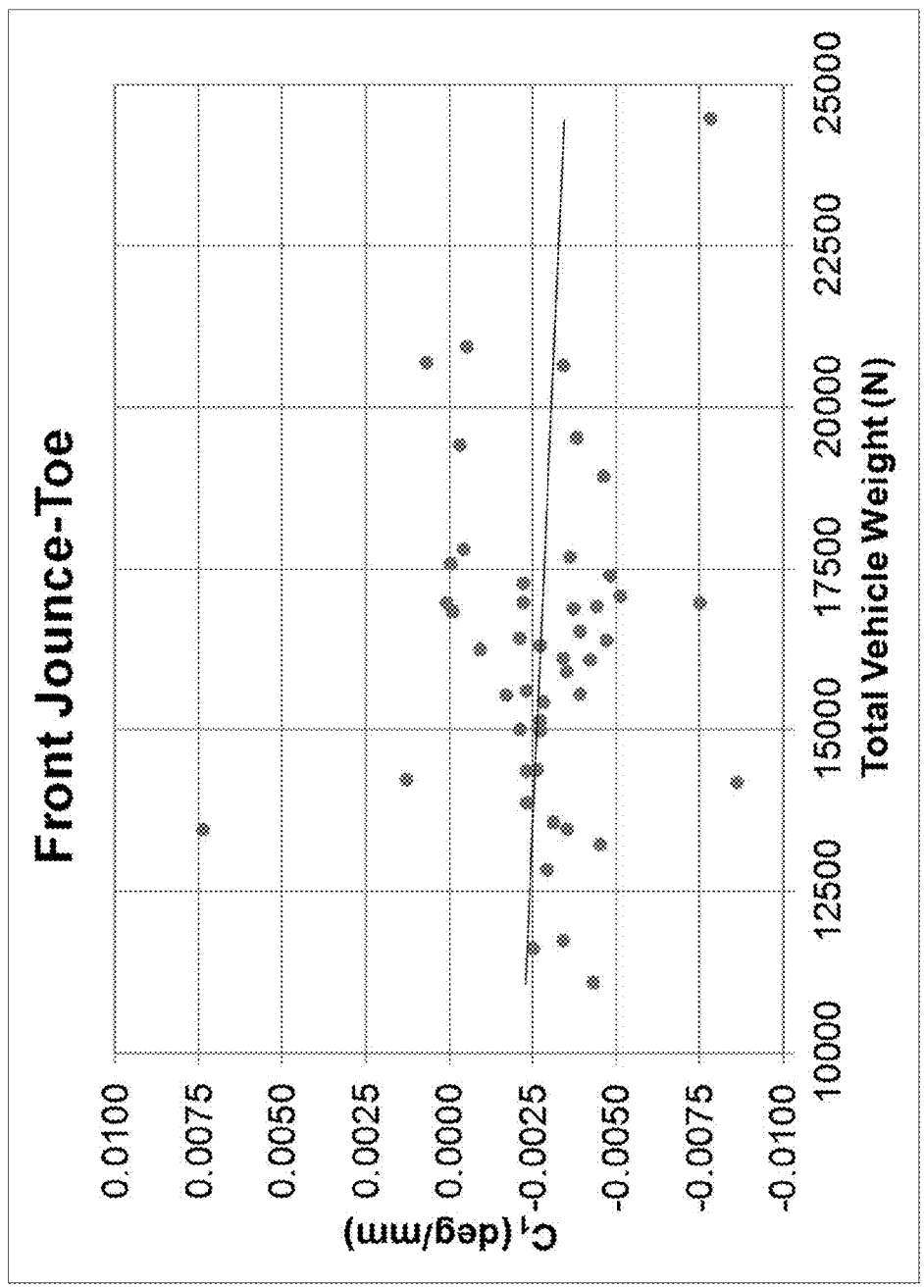
FIG. 12 illustrates example results following P(W) regression analysis of a data set.

Scalable properties of vehicles may be divided into three broad categories, such as suspension compliances and kinematics, steering kinematics, and tire force and moment (see FIG. 7). Suspension characteristics may have an effect on the tire force and moment that are produced in simulations over road courses. Suspension kinematics may include both static alignment settings and changes in toe and camber with jounce and rebound. To characterize suspension kinematics, the independent variable A in one example may be jounce or suspension deflection. The vehicles plotted in FIG. 10 were selected to demonstrate the total vehicle weight dependency or independency of the suspension kinematics. In one embodiment, total weight is dependent upon jounce-toe relationship. FIG. 11 shows the jounce-toe measurements for vehicle E from FIG. 10. The measurements may be performed on a K&C machine. This plot shows that a cubic polynomial can be used to represent these measurements accurately. The resulting cubic polynomial approximation of front suspension toe change for vehicle E is $Toe=-0.0099-0.0085\ A-5\times10^{-5}\ A^2-3\times10^{-8}\ A^3$. This cubic polynomial approximation process was applied to 52 vehicles and then regressions were performed on each set of the coefficients of the cubic polynomial approximations as a function of W. The regression yielded $C_1(W)=a_{10}+a_{11}W=-1.322\times10^{-3}-3.885\times10^{-7}W$, which is plotted in FIG. 12. For the applications of interest, $C_1(W)$, which is the slope at jounce=0, may be most important. The regression results demonstrated a small sensitivity of the initial slope to W, even though there was considerable variation from vehicle to vehicle.

Figure 13:
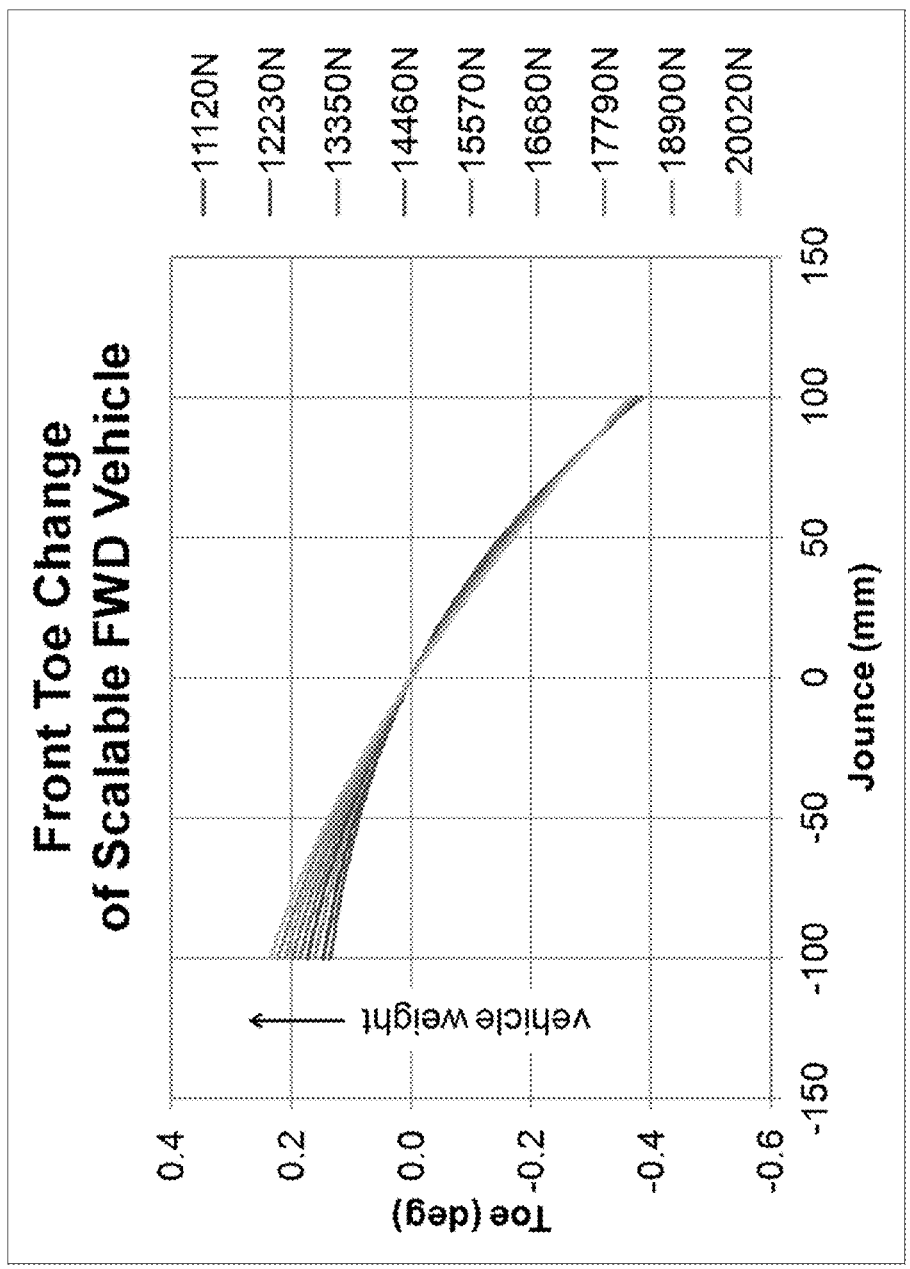
FIG. 13 illustrates example results following P(W) regression analysis of a data set.

The parameters $C_0(W)$, $C_2(W)$, and $C_3(W)$ were determined in like manner. The final result of the characterization of front suspension jounce-toe for this SVM is shown in FIG. 13. This function shows a small sensitivity to the total vehicle weight and removes the relatively large individual vehicle-to-vehicle bias.

Figure 14:
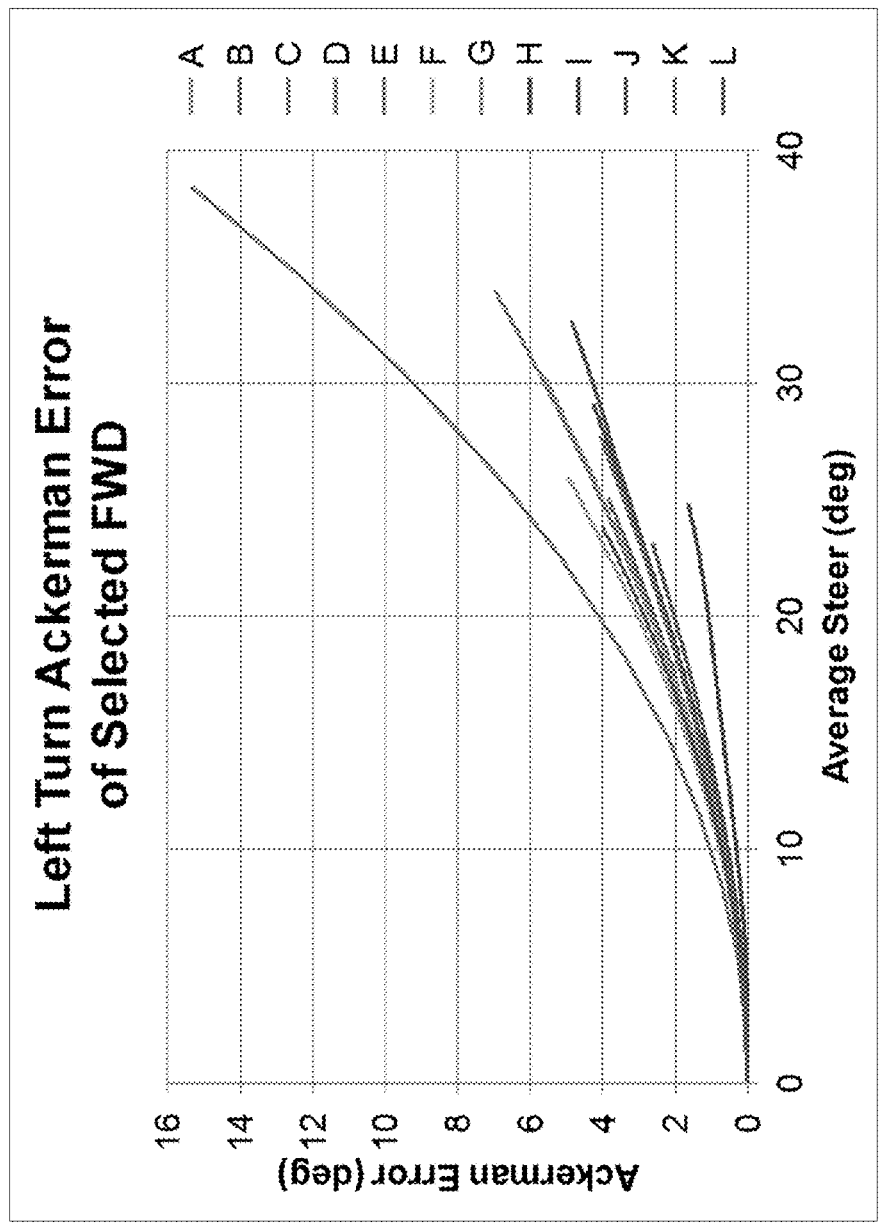
FIG. 14 illustrates example results following P(W) regression analysis of a data set.

Steering characteristics may have an effect on lateral tire forces, particularly in low speed, tight corners seen in city driving. Ackerman error may be chosen to demonstrate how the regression model is applied to characterize steering kinematics. Independent variable A is the average steer of the front wheels. FIG. 14 shows the left-turn Ackerman Error measurements for the same subgroup of vehicles used in the jounce-toe example. Here the Ackerman Error may be defined as the difference between the average steer of the front wheels and the theoretical Ackerman angle. The process of characterizing steering kinematics may be similar to those applied in characterizing suspension kinematics. The first step of the characterization may be to determine the polynomial approximation for each individual Ackerman Error set of the measurements as a function of steer angle. The second step may be to regress the polynomial coefficients as a function of W. However, the regression showed no significant dependence of steering kinematics on W.

Figure 15:
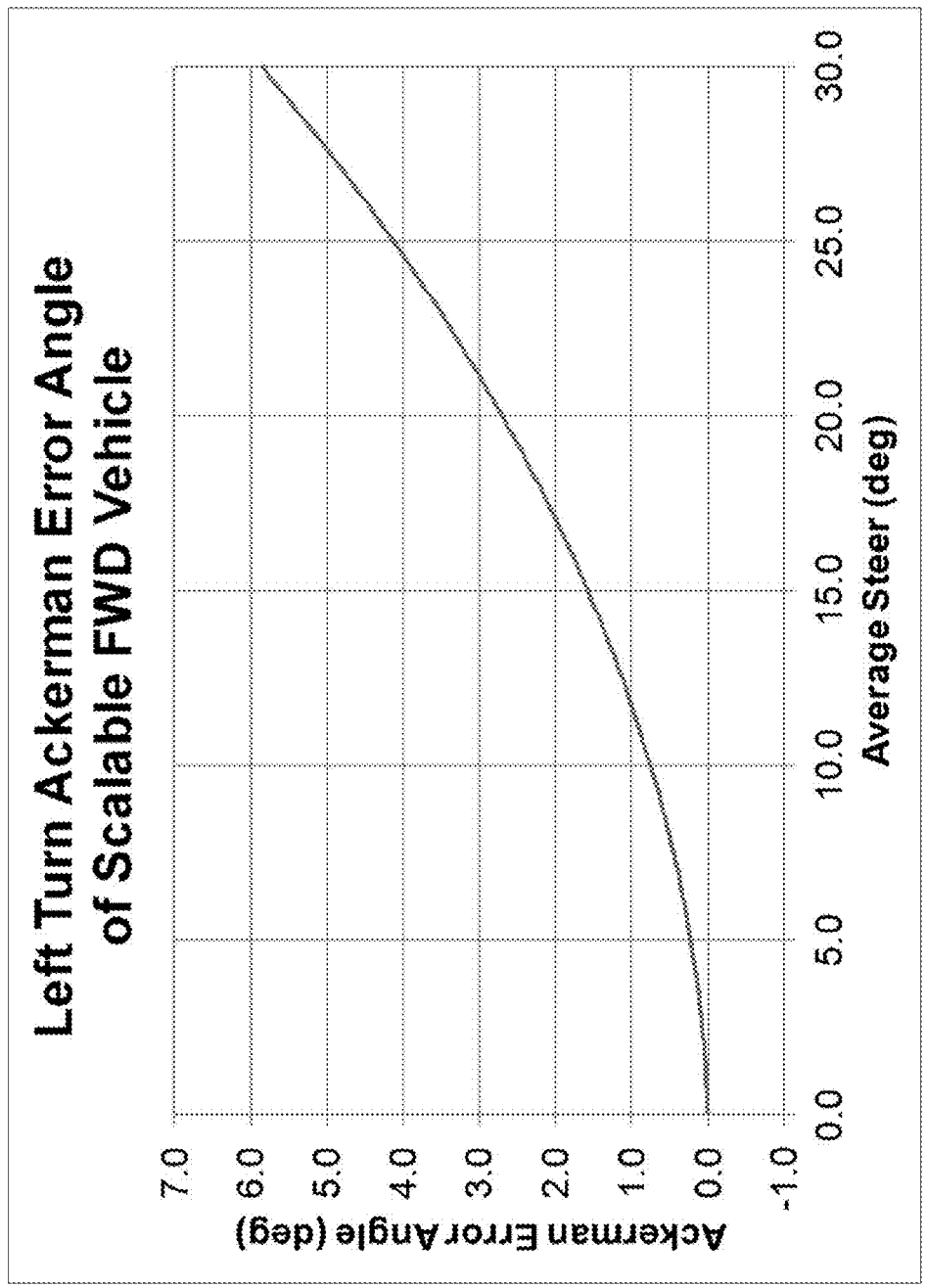
FIG. 15 illustrates example results following P(W) regression analysis of a data set.

FIG. 15 shows the resulting curve of the left-turn Ackerman Error for the SVM which is expressed as P(W)=Ackerman Error=$0.0148 A+0.006 A^2$, where A is the steer angle. The right-turn Ackerman Error may be determined in like manner. Since there is no vehicle weight dependence, a single curve may be applied to the SVM regardless of the vehicle weight.

Tire force and moment properties ("F&M") may include spring rate, longitudinal force $F_x$, lateral force $F_y$, aligning moment $M_z$, and camber thrust. Among these properties, the processes of characterizing $F_x$, $F_y$ and $M_z$ may be more complex. The characterization of $F_y$ may demonstrate the characterization process, as the processes of characterizing $F_x$ and $M_z$ are similar. Spring rate and camber thrust may be characterized using the processes described above for suspension compliance and kinematics, respectively. In one embodiment, all tire F&M may be characterized in pure cornering or pure braking conditions. In another embodiment, the CarSim® MBVDSS internal tire model may be used.

The characterization of tire $F_y$ for SVM applications may consist of three steps:
1. Develop a cornering coefficient (CC) model. The cornering coefficient of a tire is a function of vertical load applied as well as total vehicle weight.
2. Determine the total vehicle weight dependency of CC through regression.
3. Develop the $F_y$ model from CC using cubic spline function assuming $F_y$ saturation at a slip angle of 10 degrees.

Figure 16:
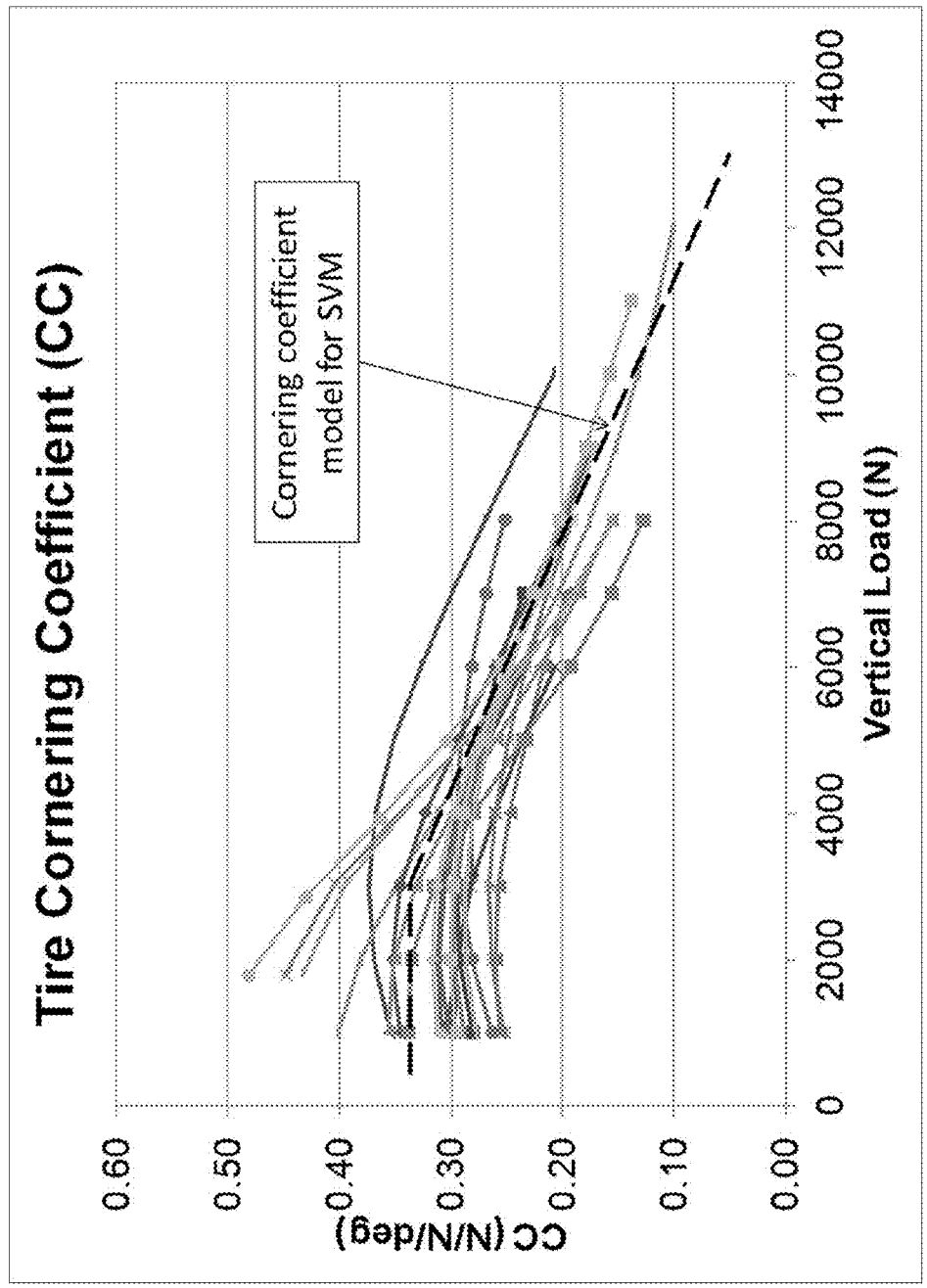
FIG. 16 illustrates example results following P(W) regression analysis of a data set.
Figure 17:
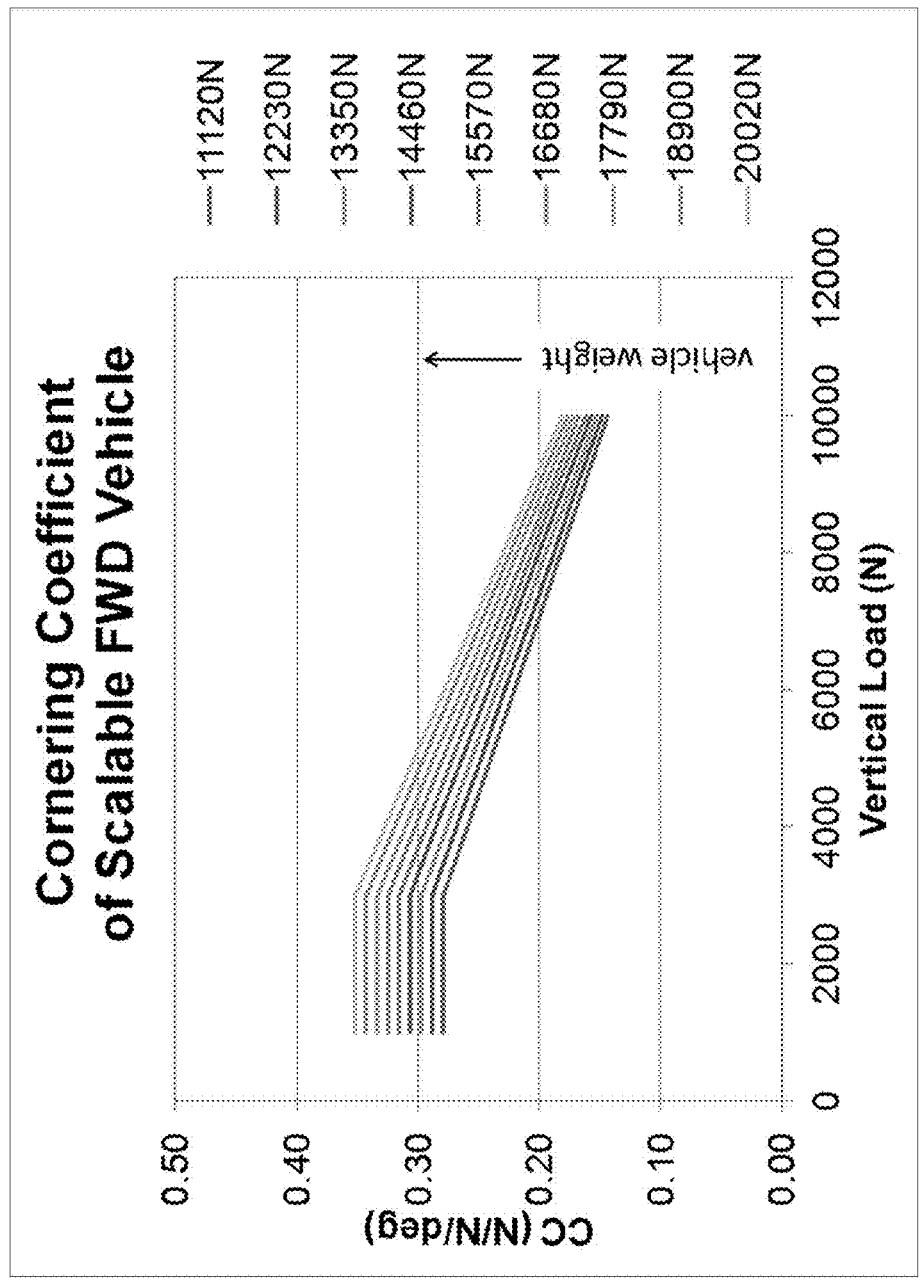
FIG. 17 illustrates example results following P(W) regression analysis of a data set.
Figure 18:
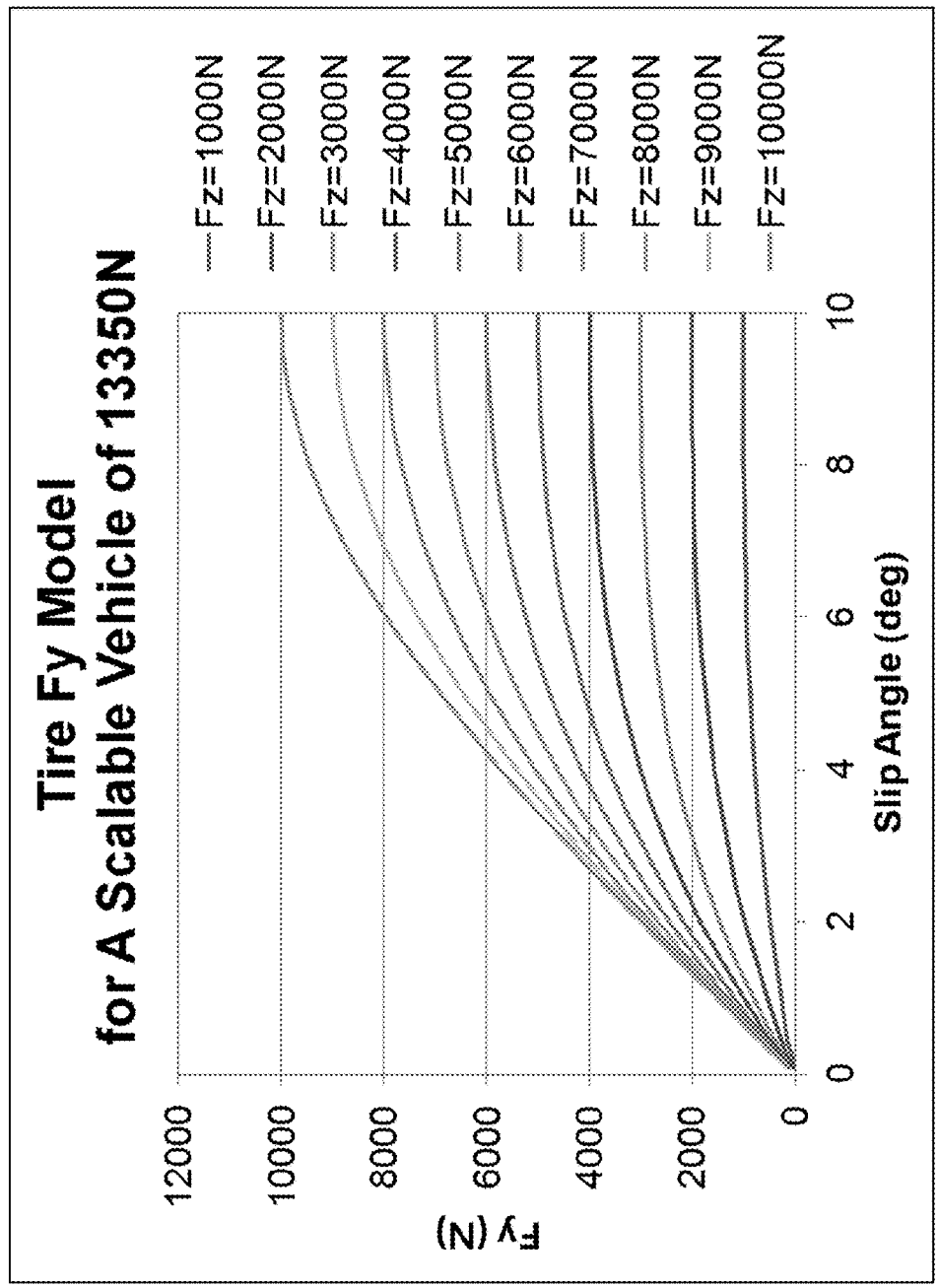
FIG. 18 illustrates example results following P(W) regression analysis of a data set.

The characterization of $F_y$ requires the knowledge of CC. FIG. 17 illustrates measurements of the CC's for tires from the previous 52 vehicle models. As a first step, based on the experimental data, a bi-linear CC model as a function of the applied vertical load may be assumed as shown in FIG. 16 in dashed line. This bi-linear model may assume the tire cornering coefficient to be constant up to a 3,000 N (674 lbf) vertical load. The CC then may be assumed to decrease with increasing vertical load. For each of the 52 vehicles, a separate bi-linear model may be created, accordingly. As a second step, the constant part of the bi-linear CC models may be regressed as a function of W. The dependency of the bi-linear CC model on W is graphed in FIG. 17. The final step is illustrated in FIG. 18 and is the tire $F_y$ model of a SVM vehicle weighing 13,350 N (3,001 lbf). The lateral force generated by the tire may be a function of the slip angle as well as the vertical load applied. These curves may be generated using cubic splines having initial slopes determined from the bi-linear CC model shown in FIG. 17 for a 13,350 N (3,001 lbf) SVM vehicle. The spline function may assume that the lateral force is saturated at 10 degrees of slip angle. This assumption may be valid because wear and durability maneuvers typically only produce slip angles up to about 4 degrees. The lateral force vs. slip angle function may thus be dependent on the total vehicle weight as well.

The characterization of tire $F_x$ and tire $M_z$ follow the same general three-step process as described above for CC. However, the characterization of tire $F_x$ and tire $M_z$ differ in that rather than involving CC, the tire $F_x$ characterization involves a slip stiffness coefficient, while the tire $M_z$ characterization involves an alignment torque coefficient. The concepts and calculations involving CC, slip stiffness coefficient, and alignment torque coefficient are well known in the art of tire modeling and design.

In one embodiment, the predicted tire force and inclination angle data may be used to drive an indoor tire wear test machine. Indoor wear testing of a tire may comprise application of a tire to a wear test drum. The tire may be mounted on a rim, which is affixed to a mechanism comprising an axle. The tire may be inflated to its intended operating pressure, or any desired possible pressure. The wear test drum may provide a rotating cylindrical surface configured to simulate a road surface. The tire may be contacted against the wear test drum to simulate a tire operating on a road surface. The mechanism may be configured to apply the tire against the wear test drum with specific forces and inclination angle. The application forces of the tire against the wear test drum may represent a tire's loading due to the weight of the vehicle, the cargo of the vehicle, acceleration of the vehicle, deceleration of the vehicle, velocity of the vehicle, cornering of the vehicle, and the like. The application inclination angle of the tire against the wear test drum may represent a tire's inclination angle due to jounce, weight of the vehicle, acceleration of the vehicle, deceleration of the vehicle, cornering of the vehicle, and the like. In one embodiment, the indoor tire wear test machine may be provided by MTS Systems Corporation of Eden Prairie, Minn., under the name MTS Tire Tread Wear Simulation System. In another embodiment, the indoor tire wear test machine may be any machine or system configured to test the wear rate of a tire as described above.

In another embodiment, the predicted tire force and inclination angle data is used to drive an indoor tire test machine. The indoor tire test machine may be configured to test the tire's durability. In one embodiment, the indoor tire test machine is configured to test the tire's wear. In another embodiment, the predicted tire force and inclination angle data is used to input information into a FEA.

FIG. 4 illustrates an example method 400 for creating a SVM for tire design and testing. The method comprises defining a vehicle segment representing a plurality of individual vehicles having various weights and at least one tire (step 402). The method may comprise defining at least one vehicle model parameter, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning moment, and the tire's camber thrust (step 404). The method may comprise determining a parameter regression function of at least one vehicle model parameter, wherein the regression function provides the average value of the at least one vehicle model parameter for the range of weights of the vehicles comprising the defined vehicle segment, wherein the parameter regression function is characterized as a function of the total weight of a SVM by the equation $P(W)=C_0(W)+C_1(W)A+C_2(W)A^2+C_3(W)A^3$, wherein W is the total weight of the SVM, wherein P(W) is the at least one vehicle model parameter, wherein $C_n(W)$ is a regression coefficient as a function of W, and wherein A is an independent variable, including at least one of: a vehicle's jounce and a vehicle's steering angle (step 406).

Figure 5:
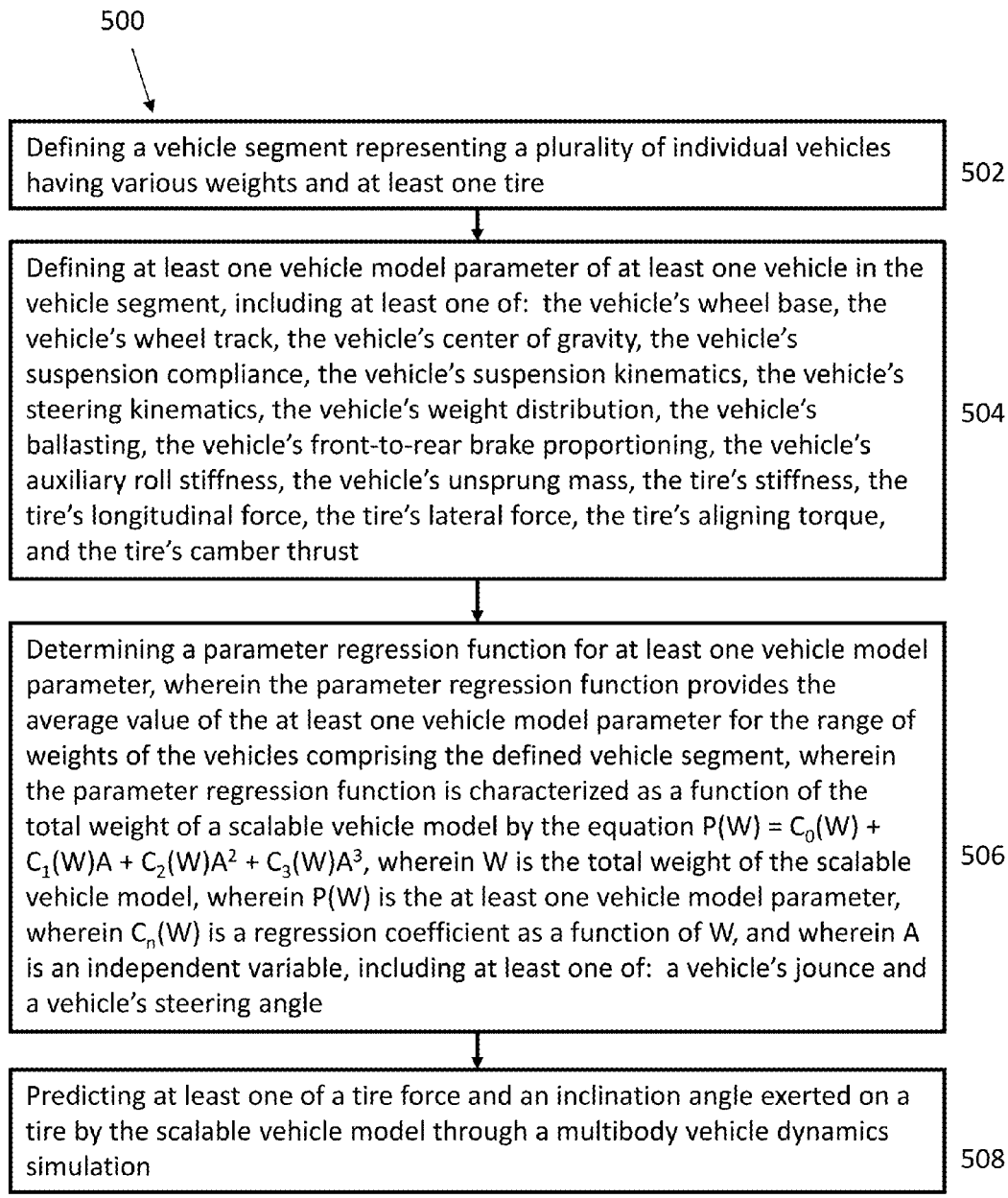
FIG. 5 illustrates an example method 500 for predicting at least one of a force and an inclination angle exerted on a tire.

FIG. 5 illustrates an example method 500 for predicting at least one of a force and an inclination angle exerted on a tire by a vehicle in a particular vehicle segment. The method comprises defining a vehicle segment representing a plurality of individual vehicles having various weights and at least one tire (step 502). The method may comprise defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning moment, and the tire's camber thrust (step 504). The method may comprise determining a parameter regression function of at least one vehicle model parameter, wherein the regression function provides the average value of the at least one vehicle model parameter for the range of weights of the vehicles comprising the defined vehicle segment, wherein the parameter regression function is characterized as a function of the total weight of a SVM by the equation $P(W)=C_0(W)+C_1(W)A+C_2(W)A^2+C_3(W)A^3$, wherein W is the total weight of the SVM, wherein P(W) is the at least one vehicle model parameter, wherein $C_n(W)$ is a regression coefficient as a function of W, and wherein A is an independent variable, including at least one of: a vehicle's jounce and a vehicle's steering angle (step 506). The method may comprise predicting at least one of a tire force and an inclination angle exerted on a tire by the SVM through a multibody vehicle dynamics simulation (step 508).

Figure 6:
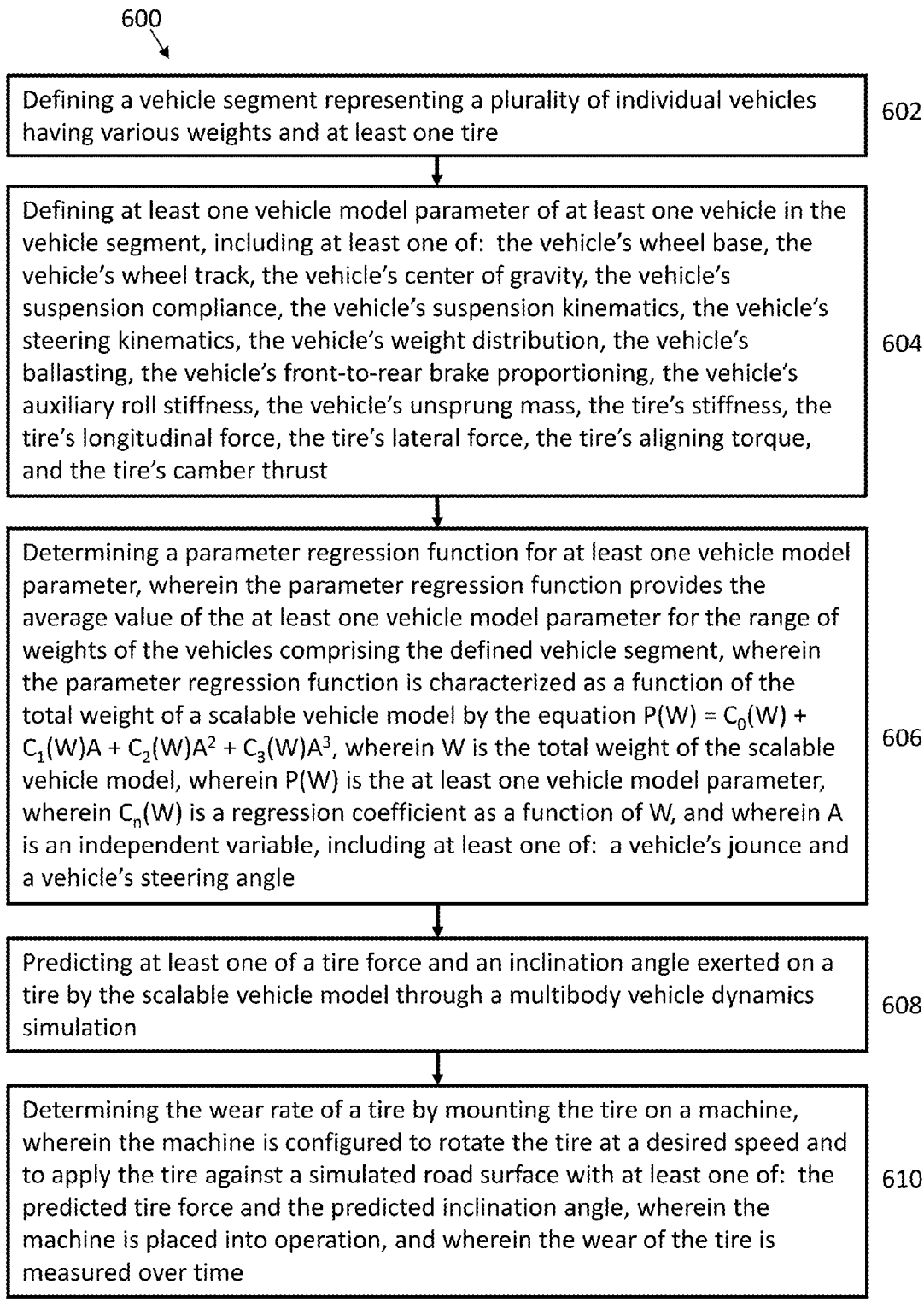
FIG. 6 illustrates an example method 600 for determining a wear rate of a tire.

FIG. 6 illustrates an example method 600 for determining the wear rate of a tire for use with a particular vehicle segment. The method comprises defining a vehicle segment representing a plurality of individual vehicles having various weights and at least one tire (step 602). The method may comprise defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning moment, and the tire's camber thrust (step 604). The method may comprise determining a parameter regression function of at least one vehicle model parameter, wherein the regression function provides the average value of the at least one vehicle model parameter for the range of weights of the vehicles comprising the defined vehicle segment, wherein the parameter regression function is characterized as a function of the total weight of a SVM by the equation $P(W)=C_0(W)+C_1(W)A+C_2(W)A^2+C_3(W)A^3$, wherein W is the total weight of the SVM, wherein P(W) is the at least one vehicle model parameter, wherein $C_n(W)$ is a regression coefficient as a function of W, and wherein A is an independent variable, including at least one of: a vehicle's jounce and a vehicle's steering angle (step 606). The method may comprise predicting at least one of a tire force and an inclination angle exerted on a tire by the scalable vehicle model through a multibody vehicle dynamics simulation (step 608). The method may comprise determining the wear rate of a tire by mounting the tire on a machine, wherein the machine is configured to rotate the tire at a desired speed and to apply the tire against a simulated road surface with at least one of: the predicted tire force and the predicted inclination angle, wherein the machine is placed into operation, and wherein the wear of the tire is measured over time (step 610).

One application of a SVM for indoor tire wear testing may be the UTQG test for the relative grading of tires for tread wear. During the tire development process for a new line or model of trade tires, it is desirable to quickly and accurately evaluate a number of different prototype tire designs as well as different sizes on an indoor tire wear test machine to predict the UTQG tread wear grade. For this purpose a SVM is needed that is representative of a vehicle segment, for example pick-up trucks with equal front and rear ballasting at nominal alignment. Tires subjected to the UTQG testing may be placed in an indoor tire testing apparatus, which includes a wear test drum. The wear test drum provides a rotating surface that engages the tire to simulate a road surface. The testing apparatus provides mechanisms for varying the force between the tire and the rotating surface. The velocity of the rotating surface and the inclination angle of the tire may also be varied. The indoor UTQG wear test may be run in a fraction of the time that it would take to run an outdoor UTQG test. Furthermore, the indoor UTQG wear test may provide more accurate and consistent data because it removes many of the variables associated with the outdoor UTQG test, including without limitation, the driver, the road surface, weather and ambient conditions, and vehicle bias. The more accurate the test data, the more accurate the UTQG ratings for each tire. The more accurate the UTQG rating for a tire, the greater the consumer's confidence in the tire manufacturer, thereby increasing the consumer's brand satisfaction and loyalty.

Figure 19:
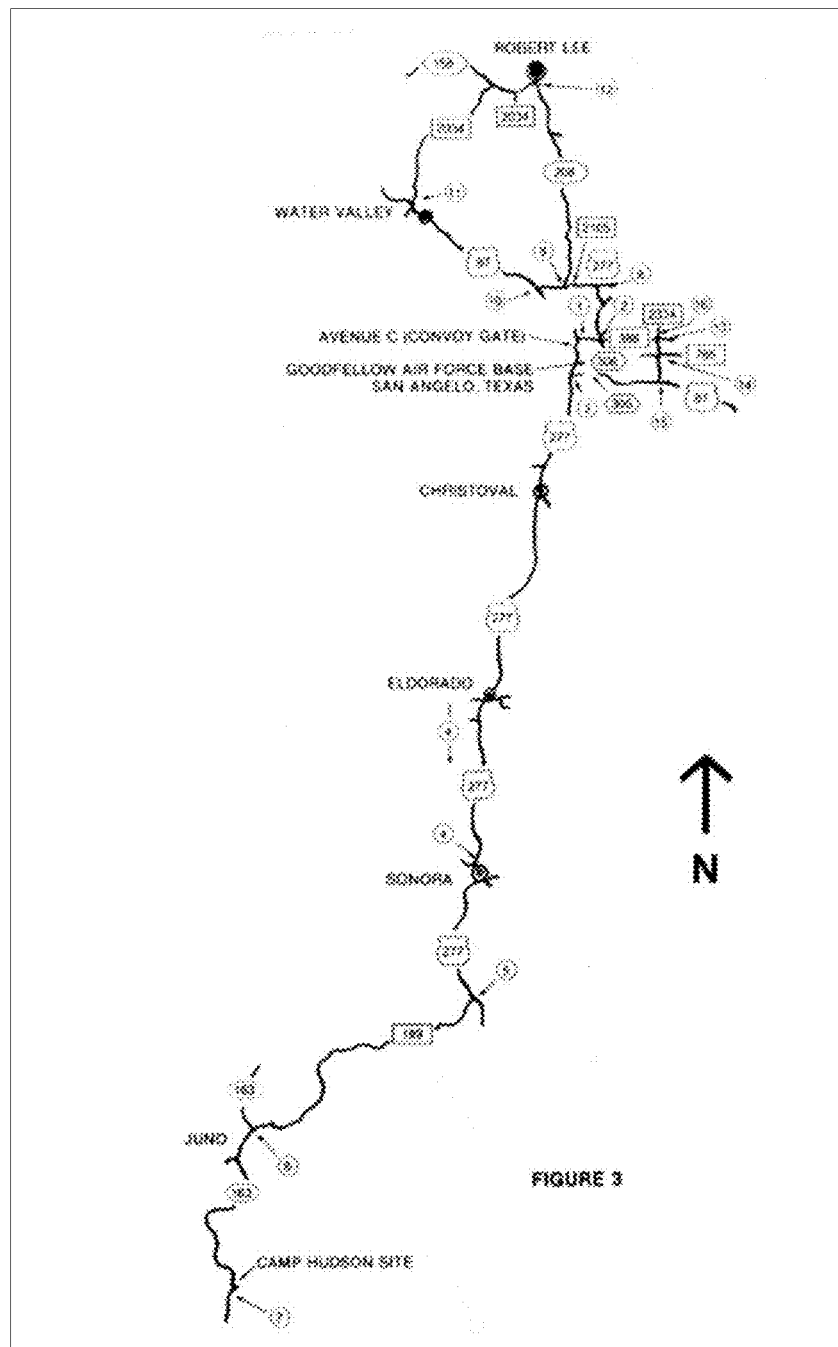
FIG. 19 illustrates the National Highway Traffic Safety Administration's Uniform Tire Quality Grading wear course.
Figure 20:
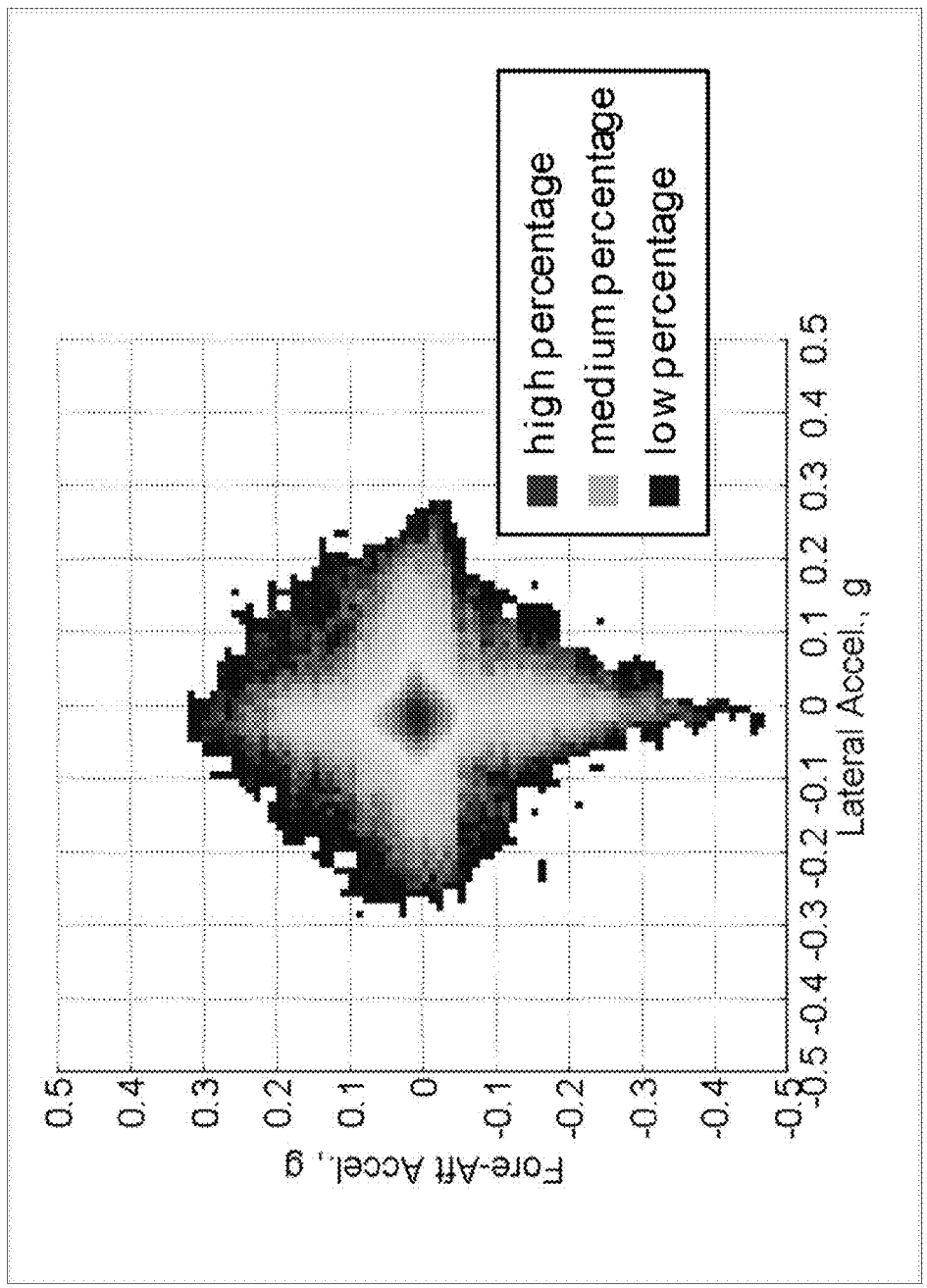
FIG. 20 illustrates example results of lateral and longitudinal accelerations of the Uniform Tire Quality Grading wear course.

Model verification may be conducted by comparing the tire load histories generated by the SVM to those from the individual vehicles that were used in the SVM development. For these comparisons, CarSim® MBVDSS models were developed using the SVM properties for nine different vehicle weights from 11,100 N (2,495 lbf) to 22,250 N (5,002 lbf). These tire load histories were then compared to the individual load histories from the 52 vehicles that were originally used to develop the FWD SVM. To make the comparisons as realistic as possible, the tire load histories were generated from each of the vehicle models for an actual wear route. For this example, acceleration and GPS measurements were collected at one meter intervals over the U.S. Department of Transportation's 640 km UTQG wear route near San Angelo, Tex. (see FIG. 19). Color contour plots of the lateral and longitudinal accelerations are shown in FIG. 20. This road course consists of left and right cornering below 0.3 g, accelerations below 0.3 g, and decelerations below 0.4 g.

For a quick assessment of the 640 km long tire force histories, a metric was introduced called the Force Severity Number ("FSN"), which assesses the load history severity with respect to tread wear.

$$FSN = \frac{1}{N}\left\{\sum_n \frac{F_y^2}{F_z} + \sum_n \frac{F_x^2}{F_z}\right\}$$

where:
$F_y$=lateral force;
$F_x$=longitudinal force;
$F_z$=radial or normal force; and
n=total number of measurements.

Summations were conducted on a meter-by-meter distance basis and normalized by the total. The physics behind this simple formula is that the severity may be related to the power that passes through the tire. Power is proportional to the product of slip and force integrated over the distance traveled. The product of slip angle and lateral force is approximated by the product of ($F_y/F_z$) and lateral force $F_y$. A similar reasoning is applied to the longitudinal slip and longitudinal force. Camber angle enters in only with respect to the lateral force produced by the tire's camber thrust stiffness.

Figure 21:
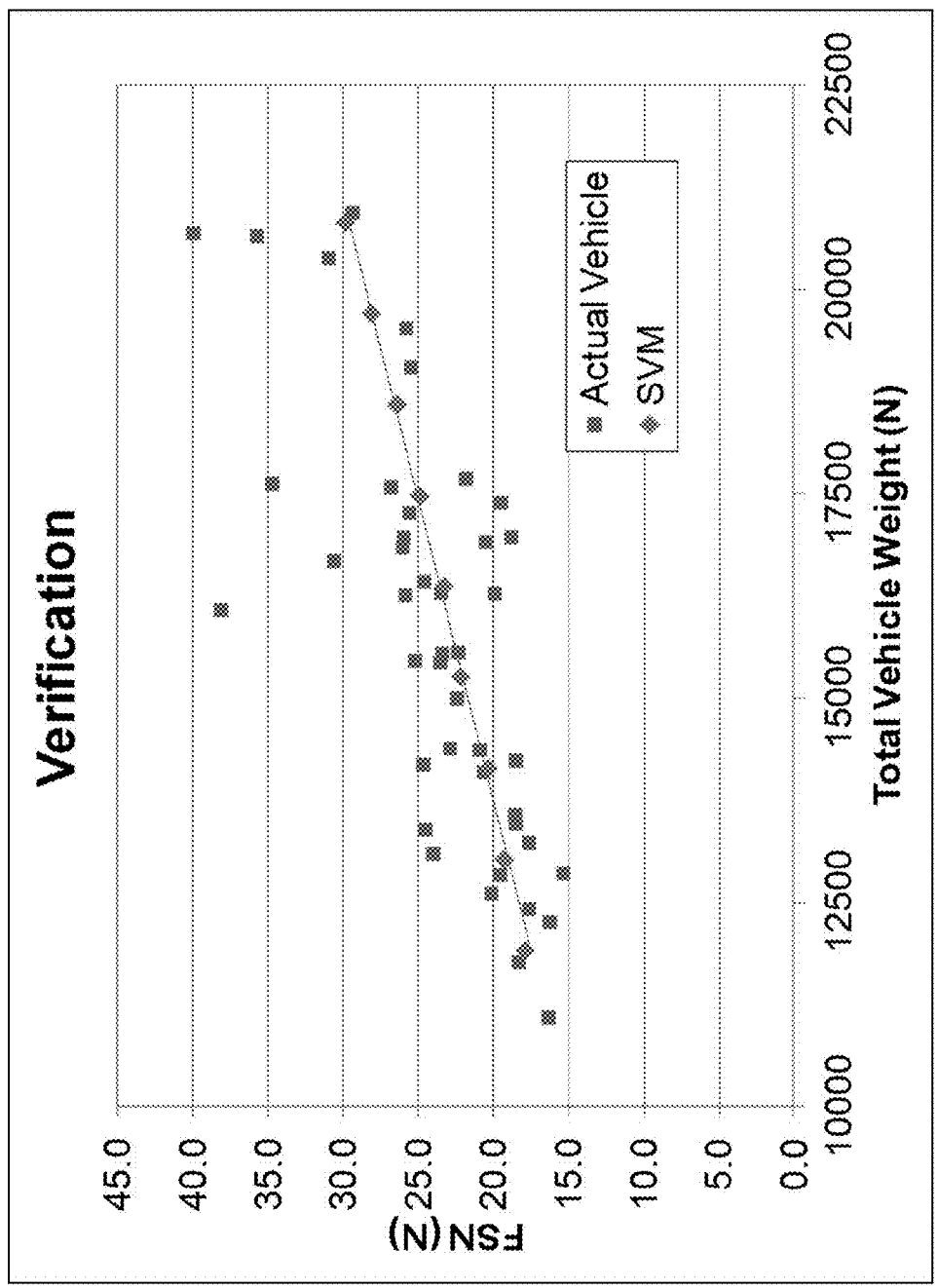
FIG. 21 illustrates example results following Force Severity Number regression analysis of a data set.

FIG. 21 shows the FSN values for each of the nine SVM weights and the individual vehicle models. All four tire positions were averaged to simulate tire rotation. Static alignments were set to nominal. The SVM model is not limited to only the nine vehicle weights used. It can be used for any vehicle load. These nine conditions appeared essentially linear with respect to the FSN metric. This linearity was not forced by any of the assumptions made in deriving the SVM vehicle properties. The 52 individual vehicles were clustered about the SVM FSN values. A few of the vehicles were approximately 50% more severe than the SVM equivalent value, at least based on this FSN metric, but in most cases vehicles are within ±20% of their SVM equivalent value.

A wear grade may be assigned to each test tire and normalized by the wear rate of a P195/75R14 Course Monitoring Tire ("CMT"). The test calls for a 4,580 N (1,030 lbf) load for this tire size on all four positions of the vehicle. In order to achieve this ballasting requirement, pick-up trucks are most often used. Even so, there is only a limited range of ballasting capabilities for each size truck. If test tires are of different sizes they often have load requirements much different than the CMT and therefore require different size trucks, as there is only a limited range of ballasting physically possible. This may make it impossible to rotate the CMT and test tires between vehicles. Thus, vehicle-to-vehicle bias is introduced.

Figure 22:
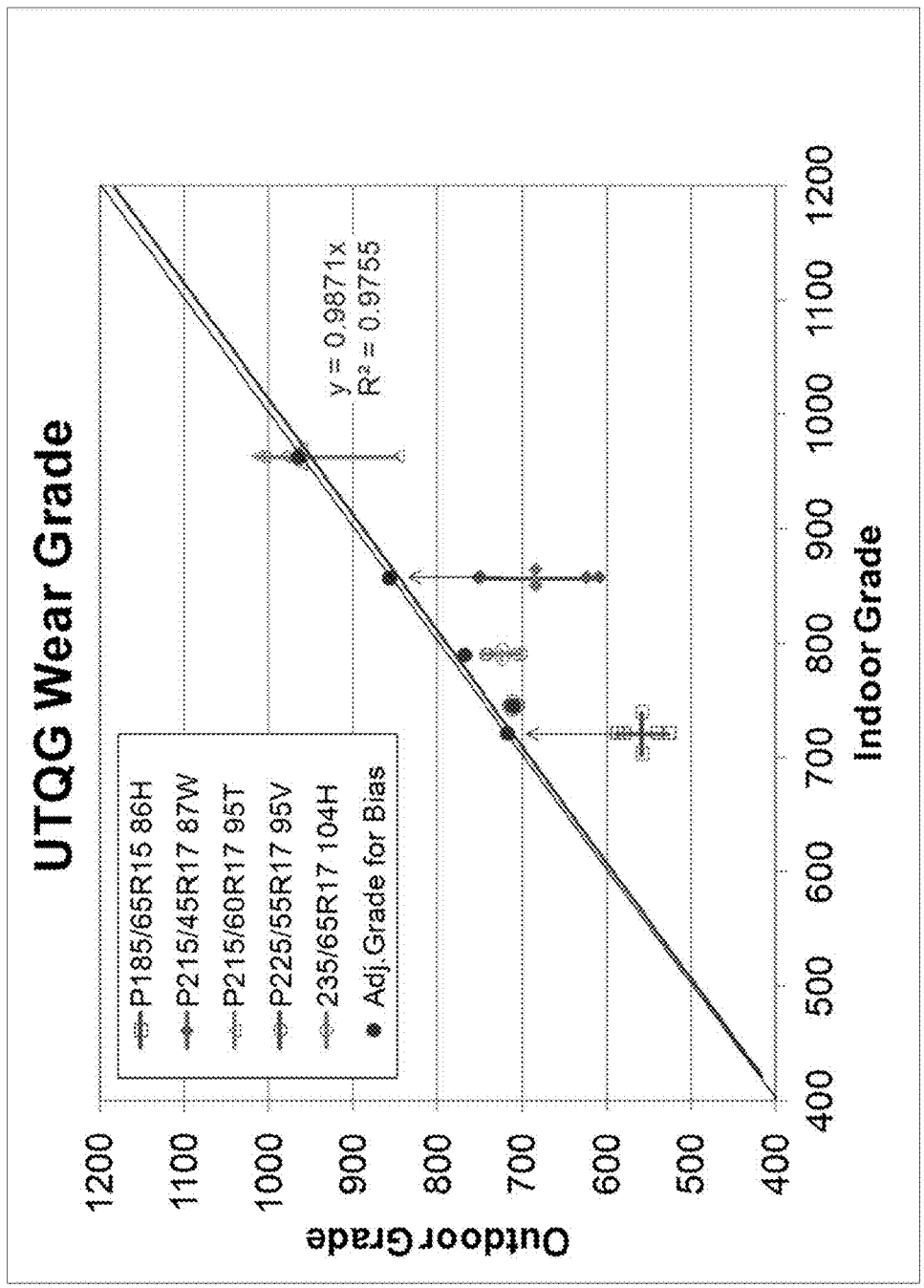
FIG. 22 illustrates example verification results of indoor and outdoor Uniform Tire Quality Grade tests.

A second SVM utilizing separate coefficients may be developed for pick-up trucks with equal ballasting at all four tire positions. This second model may be developed in the same manner as previously discussed using a wide range of trucks, from compact to ¾ ton size, and from a variety of manufacturers. This second SVM may be used to generate load histories for different sizes of tires (for example, five different sizes of tires) in addition to the CMT size for the 640 km UTQG route. These load histories may then be used to program a tire wear test machine. Since this test is a rotated position test, four different load histories may be used for each indoor tested tire, one for each position of the vehicle. The load histories may be rotated for each tire using the same rotation schedule used for the outdoor test. In addition, outdoor UTQG wear tests may be conducted using six test vehicles (e.g. five vehicles with test tires and one vehicle with the CMT) with loads varying from 3,830 N (861 lbf) to 6,490 N (1,459 lbf) per position. UTQG wear grades are shown in FIG. 22 for both outdoor and indoor wear tests. In the outdoor tests, the range of wear grades for each of the four tires on the five test vehicles is shown as individual data points. In the indoor wear test, two tires of each tire design were tested. General agreement between indoor and outdoor wear test results can be seen; however, the indoor grade of the P185/65R16 and the P215/45R17 tires were more than 100 grade points lower on the outdoor test.

The load histories for the indoor wear tests may be generated from the SVM at the required load for each tire size and the outdoor tire load histories may be specific to each of the individual vehicles which were also chosen based on the tire static load requirements. In order to estimate if the disagreement between the indoor and the outdoor wear grades were the result of differences between the SVM load histories versus the specific vehicle load histories, the FSN values may be calculated for each load history. CarSim® MBVDSS vehicle models may be created for each of the outdoor vehicles at the appropriate ballast conditions and at the same suspension alignments used during the test. The ratio of each of these test vehicles' FSNs to the equivalent SVM FSNs may then be used to calculate a vehicle bias. If the ratio is greater than one, then that vehicle would be expected to be more severe for tire wear than the outdoor test tires average vehicle. Conversely, if the ratio is less than one, then that specific vehicle would be expected to be less severe for tire wear.

Each vehicle bias may be calculated, including the vehicle used for the CMT tire. The outdoor wear rates may then be adjusted by dividing by this value in order to remove the vehicle-to-vehicle effects. The wear grades may be recalculated using these adjusted wear rates. These adjusted wear grades are also shown in FIG. 22 as solid circles. The two tire sizes that previously disagreed with the indoor wear results by over 100 grade points may be adjusted to new values almost exactly matching the indoor wear results. The 235/65R17 size may also be moved closer to the 1:1 line and the remaining two sizes may or may not be adjusted at all because their vehicle bias ratios were very close to unity.

This adjustment process may significantly improve the correlation of the indoor and outdoor wear results. In this particular example, two of the five tires were biased by 27 and 29% on the severe side, one by 6% on the severe side, and two by less than 1%. Vehicle-to-vehicle bias may alter tire wear rates making it difficult to evaluate wear performance. This is particularly true when evaluating tires of different sizes that require testing on different vehicles. Unfortunately, the high correlation level of the adjusted results shown in FIG. 22 cannot consistently be obtained. In this particular case both outdoor and indoor wear tests were run with tires from the same plant builds, including the CMT, and tests on all five sizes were conducted together, both outdoors and indoors. It is also difficult to obtain accurate vehicle models due to the wide variety of vehicles used for outdoor testing. In many cases the vehicles are older models with mileages up to 500,000 km. Also the indoor tests were conducted at a fixed ambient temperature and there was no attempt to match the range of ambient temperatures from the outdoor test.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See Bryan A. Garner, A Dictionary of Modern Legal Usage 624 (2d. Ed. 1995). Also, to the extent that the terms "in" or "into" are used in the specification or the claims, it is intended to additionally mean "on" or "onto." To the extent that the term "substantially" is used in the specification or the claims, it is intended to take into consideration the degree of precision available in tire manufacturing, which in one embodiment is ±6.35 mm (0.25 inches). To the extent that the term "selectively" is used in the specification or the claims, it is intended to refer to a condition of a component wherein a user of the apparatus may activate or deactivate the feature or function of the component as is necessary or desired in use of the apparatus. To the extent that the term "operatively connected" is used in the specification or the claims, it is intended to mean that the identified components are connected in a way to perform a designated function. As used in the specification and the claims, the singular forms "a," "an," and "the" include the plural. Finally, where the term "about" is used in conjunction with a number, it is intended to include ±10% of the number. In other words, "about 10" may mean from 9 to 11.

As stated above, while the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art, having the benefit of the present application. Therefore, the application, in its broader aspects, is not limited to the specific details, illustrative examples shown, or any apparatus referred to. Departures may be made from such details, examples, and apparatuses without departing from the spirit or scope of the general inventive concept.

What is claimed is:

1. A method for determining the wear rate of a tire for use with a particular vehicle segment, comprising:
    defining a vehicle segment representing a plurality of individual vehicles having various weights and at least one tire;
    defining at least one vehicle model parameter of at least one vehicle in the vehicle segment, including at least one of: the vehicle's wheel base, the vehicle's wheel track, the vehicle's center of gravity, the vehicle's suspension compliance, the vehicle's suspension kinematics, the vehicle's steering kinematics, the vehicle's weight distribution, the vehicle's ballasting, the vehicle's front-to-rear brake proportioning, the vehicle's auxiliary roll stiffness, the vehicle's unsprung mass, the tire's stiffness, the tire's longitudinal force, the tire's lateral force, the tire's aligning torque, and the tire's camber thrust;
    determining a parameter regression function for at least one vehicle model parameter,
    wherein the parameter regression function provides the average value of the at least one vehicle model parameter for the range of weights of the vehicles comprising the defined vehicle segment,
    wherein the parameter regression function is characterized as a function of the total weight of a scalable vehicle model by the equation $P(W)=C_0(W)+C_1(W)A+C_2(W)A^2+C_3(W)A^3$,
        wherein W is the total weight of the scalable vehicle model,
        wherein P(W) is the at least one vehicle model parameter,
        wherein $C_n(W)$ is a regression coefficient as a function of W, and
        wherein A is an independent variable, including at least one of: a vehicle's jounce and a vehicle's steering angle;
    predicting at least one of a tire force and an inclination angle exerted on a tire by the scalable vehicle model through a multibody vehicle dynamics simulation; and
    determining the wear rate of a tire by mounting the tire on a machine,
        wherein the machine is configured to rotate the tire at a desired speed and to apply the tire against a simulated road surface with at least one of: the predicted tire force and the predicted inclination angle,
        wherein the machine is placed into operation, and
        wherein the wear of the tire is measured over time.

2. The method of claim 1, wherein $C_n(W)$ is equal to $a_{n0}+a_{n1}W+a_{n2}W^2+a_{n3}W^3$.

3. The method of claim 1, further comprising applying the scalable vehicle model to at least one maneuver in the multibody vehicle dynamics simulation to determine at least one of:
    a longitudinal acceleration and a deceleration,
    a lateral acceleration,
    a steering angle,
    an inclination angle, and
    a tire loading history,
for each tire of the scalable vehicle model.

4. The method of claim 1, further comprising creating the scalable vehicle model scalable as a function of W.

5. The method of claim 1, further comprising creating at least one formula comprising a regression curve fit of a tire load as a function of W.

6. The method of claim 1, further comprising:
    developing a coefficient model for at least one tire property,
    wherein the coefficient model characterizes one of a cornering coefficient, a slip stiffness coefficient, and an aligning torque coefficient, and
    wherein the coefficient model is a function of W and a vertical load exerted on a tire;
    determining a total weight dependency of the coefficient model through a coefficient regression function,
    wherein the coefficient regression function is a function of W; and
    developing a scalable tire model of at least one of: a tire lateral force, a tire longitudinal force, and a tire aligning moment,
    wherein the scalable tire model is a function of a slip angle and the vertical force exerted on the tire.

7. The method of claim 6, wherein the coefficient regression function is a bi-linear function, and wherein the scalable tire model is modeled as a cubic spline function.

* * * * *